(12) United States Patent
Iwasaki et al.

(10) Patent No.: US 8,271,460 B2
(45) Date of Patent: Sep. 18, 2012

(54) COMPUTER PROGRAM AND COMPUTER SYSTEM FOR PRODUCING TEST FLOW

(75) Inventors: Kazuhiko Iwasaki, Tokyo (JP); Masayuki Arai, Tokyo (JP); Kenichi Ichino, Tokyo (JP)

(73) Assignee: Silicon Test Technologies. Inc., Tokyo (JP)

( * ) Notice: Subject to any disclaimer, the term of this patent is extended or adjusted under 35 U.S.C. 154(b) by 6 days.

(21) Appl. No.: 12/958,350

(22) Filed: Dec. 1, 2010

(65) Prior Publication Data

US 2011/0131217 A1 Jun. 2, 2011

(30) Foreign Application Priority Data

Dec. 1, 2009 (JP) ................... 2009-272996

(51) Int. Cl.
*G06F 17/30* (2006.01)
(52) U.S. Cl. ......................... 707/694; 707/758
(58) Field of Classification Search .................. 707/694, 707/758
See application file for complete search history.

(56) References Cited

U.S. PATENT DOCUMENTS

| | | | | |
|---|---|---|---|---|
| 5,539,652 A * | 7/1996 | Tegethoff | ........................ | 703/14 |
| 6,195,776 B1 * | 2/2001 | Ruiz et al. | ..................... | 714/738 |
| 6,539,536 B1 * | 3/2003 | Singh et al. | .................... | 716/102 |
| 6,615,389 B1 * | 9/2003 | Ohta et al. | ..................... | 716/106 |
| 2006/0282727 A1 * | 12/2006 | Hoshaku | ....................... | 714/726 |

FOREIGN PATENT DOCUMENTS

JP 2006-31354 A 2/2006

* cited by examiner

*Primary Examiner* — Son T Hoang
(74) *Attorney, Agent, or Firm* — Apex Juris, pllc; Tracy M. Heims

(57) ABSTRACT

A program executed on a computer including storage, processing, output, and input units, the storage unit storing test-difficulty-calculation-elements-database, test-menu-database, and test-flow-database, for each test-menu-record, the program causing the processing unit to execute: calculating test-difficulty for each test-menu-record based on test-difficulty-calculation-formula by using at least one among pieces of information indicative of relationship with netlist, the number of package/test pins, expected operational clock frequency, process technology information, power consumption, and tester storage space; identifying all relationship between DFT scheme and priority, and causing the storage unit to store information indicative of the relationship between the DFT scheme and priority into the test-flow-database; and sorting the DFT scheme in an order of the priority based on the relationship between the DFT scheme and priority, causing the storage unit to store the DFT scheme as a test flow, and causing the output unit to output the test flow.

28 Claims, 9 Drawing Sheets

COMPUTER PROGRAM AND COMPUTER SYSTEM FOR PRODUCING TEST FLOW

CROSS REFERENCE TO RELATED APPLICATIONS

This application claims the benefit of priority to Japanese Patent Application No. 2009-272996 filed Dec. 1, 2009, of which full contents are incorporated herein by reference.

BACKGROUND OF THE INVENTION

1. Field of the Invention

The present invention relates to a computer program that a user can use via a computer system, and that assists human users for LSI test flow generation.

2. Description of the Related Art

At a generation of a test flow, conventionally, a flow of a test which is applied to detect manufacturing defects was generated with fumbling, without concrete criteria, based only on knowledge and experience. Explaining about a test to detect manufacturing defects, at LSI production, a test is applied in order to detect defects occurring on a manufacturing process. As an example, a signal wire may short-circuit or be opened due to a small particle during manufacturing, and thus such a badly-affected device has to be detected as defective.

For recent highly-integrated LSIs, faults are not always efficiently detected if only test patterns for functional verification is applied to a target circuit as that being implemented by a designer. Therefore, it is required to modify the circuit based on design-for-testability (DFT) techniques, and then to generate appropriate test patterns. This sequence of DFT application and test pattern generation is referred to as a test flow. Generation of a test flow was done with fumbling, without concrete criteria, based only on knowledge and experience.

However, for the generation of a test flow which is done with fumbling without concrete criteria based only on knowledge and experience, a mistake of an engineer can occur, or different engineer might differently determine, and thus inconvenience might occur such as: redundantly increased LSI circuit overhead due to inclusion of unnecessary test into a test flow, increased test cost due to increased number of test patterns, yield loss (increased manufacturing cost per a good chip) due to inability to correctly identify good and defective devices, and increased field failure (degraded reliability).

If a necessary test is not included, defective chips might be shipped. If unnecessary test is included in a test flow, potentially good device might sometimes be misjudged as defective. A possible cause of misjudge for good device as defective is, for example, that a pattern is generated targeting a path which should not be tested. In particular, by a scan circuit, a device can make a transition into a specific state to which the device cannot reach under normal operation, and then a test might be applied under such a state. In other cases, since activity of a circuit during a test sometimes goes higher (that is, a device is fluttering all over) than for normal operation, some devices may slow down due to electric power shortage only at the test, and thus a part of the devices may underperform a specification due to joint effect with process variation.

If a test flow has to be re-generate, it could lead to inconvenience of increased turnaround time for design and development. Therefore, it is hoped that even inexperienced engineer can easily generate adequate test flow for a given target LSI device.

The Japanese Unexamined Patent Application Publication No. 2006-31354 discloses a technique about LSI production test.

A problem that the present invention intend to resolve is to realize a generation of a test flow without relying on an engineer's knowledge and experience, where a generated test flow includes a test required to correctly identify a good device as good and a bad device as bad, while excluding any unnecessary test.

In particular, although a generated test flow is not guaranteed as mathematically optimum, it is an intention of the present invention that an automated generation of a test flow is realized, where the generated test flow contributes to reduction of turnaround time for design and development (that is, much less than manual generation), reduction of manufacturing cost and test cost, and improvement of reliability of manufactured LSIs.

SUMMARY OF THE INVENTION 1-(1) Therefore, to resolve the problem, a computer program for producing a test flow according to the present invention is a computer program that is executed on a computer system comprising a means of memorizing to store information, a means of processing to process information, a means of output to show information to a user, and a means of input to receive a command from a user.

In addition, the means of memorizing of the computer system stores a test difficulty calculation elements database comprising a relationship between netlist, the number of package pins, the number of test pins, an expected operational clock frequency, process technology information, a power consumption during test, and a tester storage space, the means of memorizing also storing a test menu database comprising at least two test menu records wherein the test menu record is a relationship between a test difficulty calculation formula to calculate a test difficulty based on a value in the test difficulty calculation elements database, a test difficulty criterion formula, a DFT scheme, and a priority, and the means of memorizing further storing a test flow database comprising at least one relationship between the DFT scheme and the priority.

Then, the computer program utilizes the means of processing to process the following steps (1) and (2) for each test menu record in the test menu database, and utilizes the means of processing to process the following step (3):

(1) based on the test difficulty calculation formula, calculating a test difficulty for every test menu record in the test menu database, by using at least one information in the test difficulty calculation elements database in the means of memorizing among the relationship between netlist, the number of package pins, the number of test pins, an expected operational clock frequency, process technology information, a power consumption during test, and a tester storage space;

(2) from the test menu record in the test menu database, identifying all of the relationship between the DFT scheme and the priority which is related with the test difficulty criterion formula being satisfied by the calculated first test difficulty, and storing the identified relationship between the DFT scheme and the priority into the test flow database in the means of memorizing; and (3) for the relationship between the DFT scheme and the priority in the test flow database in the means of memorizing, sorting the DFT scheme in an order of the related priority, storing the sorted DFT scheme into the means of memorizing as a test flow, and then using the means of output to show the sorted DFT scheme as a test flow.

1-(2) Here, "a means of memorizing" corresponds to, for example, a memory device of a computer system, such as RAM, ROM, and HDD.

"A means of processing" corresponds to, for example, a processing unit of a computer system such as CPU, and also a central processing server computer for a computer system connected by an information communication network.

"A means of output" corresponds to, for example, a display unit of a computer system, and also a cell phone or a personal computer as an information terminal for a computer system connected by an information communication network.

"A means of input" corresponds to a input device of a computer system such as a keyboard, a mouse, and a touch-sensitive panel, and also a cell phone or a personal computer as an information terminal for a computer system connected by an information communication network.

"A computer system" may be constructed by one computer such as a personal computer, or a plurality of computers. For a example case that a computer system is constructed by a plurality of computers, "a means of processing" may correspond to a central processing server computer, "a means of memorizing" may correspond to a memory device managed by the processing server computer, "a means of output" and "a means of input" may correspond to information terminal communicating with the processing server computer such as a cell phone or a personal computer.

"A netlist" is a kind of LSI circuit description, in which a circuit is represented as a set of logic gates connected with each other. In an LSI design flow, the netlist may be obtained by logically-synthesizing a circuit which is represented as a register-transfer-level (RTL) description. From "a netlist", the number of gates, the number of FFs, and the number of functional pins (the numbers of primary inputs and outputs of the circuit) may be obtained.

"The number of package pins" means the number of pins supplied by a package, where the package applied is determined as a chip specification.

"The number of test pins" means the number of pins which can be used for LSI test, where the number of the test pins can be calculated by subtracting "the number of functional pins" and "the number of power/ground pins" from "the number of package pins".

"The number of functional pins" means the number of pins which are used for normal operation of the LSI device.

"The number of power/ground pins" means the number of pins which are used for supplying power or connecting to the earth, that is, the number of pins which are used differently from signal transmission. A summation of these numbers is called as the number of power/ground pins.

"An expected operational clock frequency" means a clock frequency of the LSI, at which speed the LSI should guarantee its correct operation. When an at-speed test (such as delay test and functional test) is performed, the expected operational clock frequency may be a factor to determine clock frequency for the test.

"A process technology information" means information about ability of a LSI manufacturing facility and characteristics of manufactured LSIs themselves, comprising cleanness of a clean room, minimum width of a line in the LSI, wiring material, and the number of wiring layers.

"A power consumption during test" means, not a power that a target LSI device consumes during its normal operation (that is, operational power consumption), but a power consumed when the LSI is tested. For recent devices to which low-power design is applied, the power consumption during test sometimes becomes larger than operational power consumption. Since LSI is designed considering only operational power consumption, a device might be damaged due to power consumed during test. Test scheme has to be carefully selected in order to suppress the power consumption during test.

"A tester storage space" corresponds to a size of memory of a tester which performs the LSI test.

"A test difficulty calculation formula" is a formula for calculating a test difficulty, where the test difficulty is calculated based on at least one information in the test difficulty calculation elements database.

"A test difficulty" means a numerical representation of difficulty of each LSI test when a specific DFT scheme is applied.

"A test difficulty criterion formula" is a formula used to determine a specific "DFT scheme" is necessary or not, based on whether the calculated test difficulty satisfies the formula or not.

"A DFT scheme" is a method to apply circuit insertion and/or modification to the LSI at a design stage, in order to perform LSI test. By these methods, test application time could be shorten, and also a test where the range of test target is widened could be applied.

"A priority" represents an order of each DFT scheme being preferably applied. Inadequate order of application of DFT schemes may cause inconvenience.

"A test menu record" comprises a relationship between a test difficulty calculation formula to calculate a test difficulty based on a value in the test difficulty calculation elements database, a test difficulty criterion formula, a DFT scheme, and a priority, and set of each test menu record organizes the test menu database. The test menu database comprises at least two test menu records.

"the test difficulty criterion formula being satisfied by the calculated test difficulty" means the condition that the calculated test difficulty satisfies a criterion which is required by the test difficulty criterion formula.

"sorting the DFT scheme in an order of the related priority" means that the DFT scheme is sorted according to a priority order represented by the priority.

1-(3) In this aspect of the present invention, at the step (1), a test difficulty is calculated for every LSI test (that is, per DFT scheme and per test menu record) stored in a test menu record in the test menu database, based on a test difficulty calculation formula, by the test difficulty calculation elements database which is storing the circuit design information.

Next, at the step (2), the relationship of the DFT scheme and the priority corresponding to the test difficulty calculated for each test menu record in the test menu database is specified, and then is stored into the test flow database.

Then, at the process of step (3), the relationship of the DFT scheme and the priority in the test flow database is sorted in the order of the priority, so that the order is consistent as a test flow, and the sorted DFT scheme is stored in the means of memorizing, as well as being output by the means of output as a test flow.

As a result of the sequence of information processing under a collaboration of hardware resources, a consistent test flow can be obtained automatically, based on the test difficulty calculation elements database which is storing information about circuit design and is constructed by information generated by a circuit designer, whether each DFT scheme is necessary being determined by calculating the test difficulty and by evaluating with the test difficulty criterion formula, and then necessary DFT scheme being sorted in the order of the priority.

Accordingly, automation of test flow generation is realized, where a generated test flow includes necessary test patterns for correct detection of faulty devices and excludes inadequate test patterns, without relying on engineer's knowledge and experience.

Also, although a generated test flow is not guaranteed as mathematically optimum, an automated generation of a test flow is realized according to reduction of turnaround time for design and development less than manual generation, reduction of manufacturing cost and test cost, and improvement of reliability of manufactured LSIs.

2-(1) Another aspect with the present invention is a computer program for producing test flow, wherein the means of memorizing may further store a second test menu database comprising a relationship between, a second test difficulty calculating formula to calculate a test difficulty based on the value in the test difficulty calculation elements database and the DFT scheme, a test difficulty criterion formula, a DFT scheme, and a priority.

Then, the computer program for producing test flow may utilize the means for processing to process the following two steps (1) and (2) for each test menu record in the test menu database, as well as the following three steps (3), (4) and (5):

(1) based on the test difficulty calculation formula, calculating a first test difficulty for every test menu record in the test menu database, by using at least one information in the test difficulty calculation elements database in the means of memorizing among the relationship between netlist, the number of package pins, the number of test pins, an expected operational clock frequency, process technology information, a power consumption during test, and a tester storage space;

(2) from the test menu record in the test menu database, identifying all of the relationship between the DFT scheme and the priority which is related with the test difficulty criterion formula being satisfied by the calculated test difficulty, and storing the identified relationship between the DFT scheme and the priority into the test flow database in the means of memorizing;

(3) based on the second test difficulty calculation formula of the second test menu database in the means of memorizing, calculating a second test difficulty by using the DFT scheme stored in the test flow database in the means of memorizing and at least one relationship in the test difficulty calculation elements database in the means of memorizing among the relationship between the netlist, the number of package pins, the number of test pins, an expected operational clock frequency, process technology information, a power consumption during test, and a tester storage space;

(4) from the second test menu database in the means of memorizing, identifying all of the relationship between the DFT scheme and the priority which is related with the second test difficulty criterion formula being satisfied by the calculated second test difficulty, and storing the identified relationship between the DFT scheme and the priority into the test flow database in the means of memorizing; and (5) for the relationship between the DFT scheme and the priority in the test flow database in the means of memorizing, sorting the DFT scheme in an order of the related priority, storing the sorted DFT scheme into the means of memorizing as a test flow, and then using the means of output to show the sorted DFT scheme as a test flow.

2-(2) Here, "a test difficulty calculation formula" is a formula for calculating a test difficulty, where the test difficulty is calculated, regarding at least one information of the values in the test difficulty calculation elements database, as well as at least one DFT scheme, as variables.

"A second test menu database" comprises at least one record, where the record comprises a relationship between a second test difficulty calculation formula, a test difficulty criterion formula, a DFT scheme, and a priority, and set of each second test menu record organizes the test menu database.

2-(3) In this aspect of the present invention, at the step (1), a test difficulty is calculated for every LSI test (that is, per DFT scheme and per test menu record) stored in a test menu record in the test menu database, based on a test difficulty calculation formula, by the test difficulty calculation elements database which is storing the circuit design information.

Next, at the step (2), the relationship of the DFT scheme and the priority corresponding to the test difficulty calculated for each test menu record in the test menu database is specified, and then is stored into the test flow database.

Further, at the step (3), a second test difficulty is calculated for every LSI test (that is, per DFT scheme and per second test menu record) stored in a second test menu record in the second test menu database, based on a test difficulty calculation formula, by the test difficulty calculation elements database which is storing the circuit design information and by the DFT scheme stored in the test flow database.

Then, at the step (4), the relationship of the DFT scheme and the priority corresponding to the second test difficulty calculated for each second test menu record in the second test menu database is specified, and then is stored into the test flow database.

Finally, at the process of step (5), the relationship of the DFT scheme and the priority in the test flow database is sorted in the order of the priority, so that the order is consistent as a test flow, and the sorted DFT scheme is stored in the means of memorizing, as well as being output by the means of output as a test flow.

As a result of the sequence of information processing under a collaboration of hardware resources, a consistent test flow can be obtained automatically, based on the test difficulty calculation elements database which is storing information about circuit design and is constructed by information generated by a circuit designer, whether each DFT scheme is necessary being determined by calculating the test difficulty and by evaluating with the test difficulty criterion formula, and then necessary DFT scheme being sorted in the order of the priority.

Especially, a consistent test flow can be obtained automatically, based not only on the test difficulty calculation elements database which is storing information about circuit design but also on information of the DFT scheme which is determined as necessary, whether each DFT scheme is necessary being determined by calculating the second test difficulty and by evaluating with the test difficulty criterion formula, and then necessary DFT scheme being sorted in the order of the priority, resulting in more flexible test flow generation.

3-(1) Still another aspect with the present invention is a computer program for producing test flow, wherein the means of memorizing may further store at least two second test menu records in the second test menu database.

Then, the computer program for producing test flow may utilize the means for processing;

to process the following two steps (1) and (2) for each test menu record in the test menu database;

to process the following two steps (3) and (4) for each second test menu record in the second test menu database; and to process the following step (5):

(1) based on the test difficulty calculation formula, calculating a first test difficulty for every test menu record in the test menu database, by using at least one information in the test difficulty calculation elements database in the means of memorizing among the relationship between netlist, the number of package pins, the number of test pins, an expected operational clock frequency, process technology information, a power consumption during test, and a tester storage space.

(2) from the test menu record in the test menu database, identifying all of the relationship between the DFT scheme and the priority which is related with the test difficulty criterion formula being satisfied by the calculated test difficulty, and storing the identified relationship between the DFT scheme and the priority into the test flow database in the means of memorizing;

(3) based on the second test difficulty calculation formula of the second test menu database in the means of memorizing, calculating a second test difficulty for every second test menu record in the second test menu database, by using the DFT scheme stored in the test flow database in the means of memorizing and at least one information in the test difficulty calculation elements database in the means of memorizing among the relationship between the netlist, the number of package pins, the number of test pins, an expected operational clock frequency, process technology information, a power consumption during test, and a tester storage space.

(4) from the second test menu record in the test menu database, identifying all of the relationship between the DFT scheme and the priority which is related with the second test difficulty criterion formula being satisfied by the calculated second test difficulty, and storing the identified relationship between the DFT scheme and the priority into the test flow database in the means of memorizing; and (5) for the relationship between the DFT scheme and the priority in the test flow database in the means of memorizing, sorting the DFT scheme in an order of the related priority, storing the sorted DFT scheme into the means of memorizing as a test flow, and then using the means of output to show the sorted DFT scheme as a test flow.

3-(2) In this aspect of the present invention, as a result of the sequence of information processing under a collaboration of hardware resources, a consistent test flow can be obtained automatically, based on the test difficulty calculation elements database which is storing information about circuit design and is constructed by information generated by a circuit designer, whether each DFT scheme is necessary being determined by calculating the test difficulty and by evaluating with the test difficulty criterion formula, and then necessary DFT scheme being sorted in the order of the priority.

Especially, a consistent test flow can be obtained automatically, based not only on the test difficulty calculation elements database which is storing information about circuit design but also on information of the DFT scheme which is determined as necessary, whether each DFT scheme is necessary being determined by calculating the second test difficulty and by evaluating with the test difficulty criterion formula, and then necessary DFT scheme being sorted in the order of the priority, resulting in more flexible test flow generation.

In addition, since the test menu database comprises at least two test menu record and the second test menu database comprises at least two second test menu record, then more variable, detailed, and flexible criteria can be set into the records of each database.

4-(1) As still another aspect with the present invention, in the computer program for producing test flow, the test menu database in the means of memorizing may comprise at least two test menu records, wherein the test menu record is a relationship between a test difficulty calculation formula to calculate a test difficulty based on a value in the test difficulty calculation elements database or based on a value in the test difficulty calculation elements database and a DFT scheme, a test difficulty criterion formula, a DFT scheme, and a priority.

Then, the computer program for producing test flow may utilize the means for processing to process;

the following two steps (1) and (2) as well as (3) and (4) for each test menu record in the test menu database; and the following step (5):

(1) based on the test difficulty calculation formula, calculating a first test difficulty for every test menu record in the test menu database, by using at least one information in the test difficulty calculation elements database in the means of memorizing among the relationship between netlist, the number of package pins, the number of test pins, an expected operational clock frequency, process technology information, a power consumption during test, and a tester storage space;

(2) from the test menu record in the test menu database, identifying all of the relationship between the DFT scheme and the priority which is related with the test difficulty criterion formula being satisfied by the calculated first test difficulty, and storing the identified relationship between the DFT scheme and the priority into the test flow database in the means of memorizing.

(3) based on the test difficulty calculation formula of the test menu database in the means of memorizing, calculating a second test difficulty for every test menu record in the test menu database, by using the DFT scheme stored in the test flow database in the means of memorizing and at least one relationship in the test difficulty calculation elements database in the means of memorizing among the relationship between the netlist, the number of package pins, the number of test pins, an expected operational clock frequency, process technology information, a power consumption during test, and a tester storage space;

(4) from the second test menu database in the means of memorizing, identifying all of the relationship between the DFT scheme and the priority which is related with the test difficulty criterion formula being satisfied by the calculated second test difficulty, and storing the identified relationship between the DFT scheme and the priority into the test flow database in the means of memorizing; and (5) for the relationship between the DFT scheme and the priority in the test flow database in the means of memorizing, sorting the DFT scheme in an order of the related priority, storing the sorted DFT scheme into the means of memorizing as a test flow, and then using the means of output to show the sorted DFT scheme as a test flow.

4-(2) As "a test menu record", there might exist one type of record in which a test difficulty calculation formula is to calculate a test difficulty based on the value in the test difficulty calculation elements database; and also another type of record in which a test difficulty calculation formula is to calculate a test difficulty based on the value in the test difficulty calculation elements database and the DFT scheme.

Thus, "utilizes the means for processing to process; the following two steps (1) and (2) as well as (3) and (4) for each test menu record in the test menu database" means that; for the former type of the records in which a test difficulty calculation formula is to calculate a test difficulty based on the value in the test difficulty calculation elements database, at least the steps (1) and (2) are processed; alternatively, for the latter type of the records in which a test difficulty calculation formula is to calculate a test difficulty based on the value in the test difficulty calculation elements database and the DFT scheme, at least the steps (3) and (4) are processed.

4-(3) In this aspect of the present invention, as a result of the sequence of information processing under a collaboration of hardware resources, a consistent test flow can be obtained automatically, based on the test difficulty calculation elements database which is storing information about circuit design and is constructed by information generated by a circuit designer, whether each DFT scheme is necessary being determined by calculating the test difficulty and by evaluating with the test difficulty criterion formula, and then necessary DFT scheme being sorted in the order of the priority.

Especially, at a stage that the test flow database is storing no DFT schemes a test flow can be generated based on the test difficulty calculation elements database which is storing information about circuit design, and at a stage that the test flow database is storing DFT schemes a test flow can be generated based on the test difficulty calculation elements database which is storing information about circuit design as well as based on the DFT scheme stored in the test flow database.

Thus, even a single test menu database is enough for flexible and detailed setting if the test menu database comprises a plurality of the records.

5-(1) As still another aspect with the present invention, in the computer program for producing test flow, the means of memorizing of the computer system may further store; a CAD tool specifying database comprising a relationship between the DFT scheme and a CAD tool; and a CAD tool environmental constraint database which stores at least one CAD tool;.

Then, the computer program for producing test flow may further utilize the means for processing to process the following step (6):

(6) among the DFT scheme included in the CAD tool specifying database in the means of memorizing, adopting only the DFT scheme which is related to the CAD tool included in the CAD tool environmental constraint database in the means of memorizing as the DFT scheme included in the test flow stored in the means of the memorizing.

5-(2) Here, "a CAD tool environmental constraint database" represents an environmental constraint according to availability of CAD tools for a user of the computer system. Since many CAD tools are expensive and there might be a case that a CAD tool which is used to apply a DFT technique shown in a test flow does not exist in the user's environment, and thus the CAD tool environmental constraint database is utilized to determine the constraint on the environment.

"A CAD tool specifying database" is a database used to specify a CAD tool which is required to actually implement a DFT scheme. Thus, there might be more than one CAD tool which can actually implement a specific DFT scheme.

5-(3) In this aspect of the present invention, if a user of the computer system inputs the environmental constraint on the CAD tool software into the CAD tool environmental constraint database in advance, only the DFT scheme which corresponds to available CAD tool software is adopted as a test flow.

Accordingly, such a test flow that is impossible to implement in the user's environment is not produced, and thus realistic test flow generation is realized, considering environments of individual users.

6-(1) As still another aspect with the present invention, in the computer program for producing test flow, the means of memorizing of the computer system may further store; a CAD tool specifying database comprising the relationship between the DFT scheme, a CAD tool, an usage priority, and a script generation information; and a CAD tool environmental constraint database which stores at least one CAD tool.

Then, the computer program for producing test flow may further utilize the means for processing to process the following step (6) for each DFT scheme stored in the means of memorizing as the test flow, in order to produce a CAD plan considering an order of the DFT scheme stored in the means of memorizing as the test flow:

(6) among the CAD tools included in the CAD tool environmental constraint database in the means of memorizing, specifying the one relating with the DFT scheme in the CAD tool specifying database in the means of memorizing and having highest value of the related usage priority, and also specifying a script generation information related with the specified CAD tool, relating the specified CAD tool and the script generation information to the DFT scheme and then storing them into the means of memorizing as the CAD plan.

6-(2) Here, "script generation information" is information for generating a kind of computer program, that is, a script, which is required to realize a specific DFT scheme. It can be specified based on the combination of the DFT scheme and the CAD tools applied.

"An usage priority" represents a priority of each CAD tool among the ones for implementing a specific DFT scheme. Thus, when there are plurality of CAD tools that can implement a specific DFT scheme, determining a priority for utilization might be preferable, according to the characteristics of the LSI and the features of the CAD tools.

Also, "to produce a CAD plan considering an order of the DFT scheme stored in the means of memorizing as the test flow" means that; based on the script generation information relating with the DFT scheme which is stored in the means of memorizing as the test flow, a script is produced considering the order of DFT scheme as the test flow, and then a program to apply the test along with the test flow is generated by the CAD tool.

"among the CAD tools included in the CAD tool environmental constraint database in the means of memorizing, the one relating with the DFT scheme in the CAD tool specifying database in the means of memorizing and having highest value in terms of the related usage priority" represents such a CAD tool that should be used in highest priority according to the DFT scheme, among the ones that, as indicated in the CAD tool environmental constraint database, the user can utilize.

6-(3) In this aspect of the present invention, if a user of the computer system inputs the environmental constraints on the CAD tool software into the CAD tool environmental constraint database in advance, only the DFT scheme which corresponds to available CAD tool software is adopted as a test flow. Accordingly, such a test flow that is impossible to implement in the user's environment is not produced, and thus realistic test flow generation is realized, considering environments of individual users.

Especially, since a script is produced considering the order of DFT scheme as the test flow based on the script generation information, the CAD plan which is immediately executable on the CAD tool can be obtained.

Furthermore, it is not necessary that the user specifically select the CAD tool to implement each DFT scheme, instead appropriate CAD tool corresponding to the user's environment is already selected in the obtained CAD plan.

7-(1) As still another aspect with the present invention, in the computer program for producing test flow, the means of memorizing of the computer system may further store; a CAD tool specifying database comprising a relationship between the DFT scheme, a CAD tool, an usage priority, and a script generation information; a convert database comprising a relationship of a convert scheme information and a CAD tool flow which relates two or more CAD tools; and a CAD tool environmental constraint database which stores at least one CAD tool.

Then, the computer program for producing test flow may further utilize the means for processing to process the following two steps (6) and (7):

(6) for each DFT scheme stored in the means of memorizing as the test flow, among the CAD tools included in the CAD tool environmental constraint database in the means of memorizing, specifying the one which is related with the DFT scheme in the CAD tool specifying database in the means of memorizing and has the highest value of the related usage priority, relating the specified CAD tool and the script generation information to the DFT scheme, and storing them in the means of memorizing, and then producing a CAD plan considering an order of the DFT schemes stored in the means of memorizing as test flow;

(7) based on the order of the CAD tool stored in the means of memorizing as the CAD plan, specifying the CAD tool flow corresponding to the order of the CAD tool among the convert database in the means of memorizing, and then, based on a convert scheme information which is relating with the specified CAD tool flow, relating and inserting the convert script along with the order of the CAD tool, then storing into the CAD plan in the means of memorizing.

7-(2) Here, "a CAD tool flow" represents information where the CAD tool is related more than twice in a specific order, and used to determine whether a convert script is executed or not when the CAD tool are applied in a specific order.

As an example of "a CAD tool flow," such an arrangement could be possible, that "a CAD tool before conversion" and "another CAD tool after conversion" are related with each other, maintaining the order of execution.

A convert script" is a program to convert data formed as a specific format which is only accessible by a specific CAD tool into another format for which another CAD can also access.

"A convert scheme information" indicates if a convert script is necessary or not, as well as, which script is when it is necessary.

"Based on the order of the CAD tool stored in the means of memorizing as the CAD plan, specifying the CAD tool flow corresponding to the order of the CAD tool" means to specify the CAD tool flow that corresponds to the order of the CAD tool which is stored as the CAD plan, where a CAD tool flow is a relation of more than one CAD tool. Not only identical match, but also partial match should be comprised "Based on a convert scheme information which is relating with the specified CAD tool flow, relating and inserting the convert script along with the order of the CAD tool" means that based on a convert scheme information which is relating with the specified CAD tool flow, if necessary, the convert script is inserted according to the order of CAD tool in the CAD plan, and the script is related with the CAD plan.

7-(3) In this aspect of the present invention, after a user of the computer system inputs the convert database comprising the relationship of CAD tool flow and convert script, the convert script is inserted according to the order of CAD tool in the CAD plan, if the order of the CAD tool as the CAD plan requires the execution of the convert script.

Accordingly, even for the case that the test flow is executed on multiple different CAD tools, the user can generate a CAD plan without worrying about the difference of CAD tool environment.

8-(1) As still another aspect with the present invention, in the computer program for producing test flow, the means of memorizing of the computer system may further store at least one test constraint estimation formula in order to calculate a test constraint value based on at least one DFT scheme and the value in the test difficulty calculation elements database.

Then, the computer program for producing test flow may further utilize the means for processing to process the following three steps (6), (7), and (8):

(6) for each test constraint estimation formula in the means of memorizing, calculating a test constraint value based on the test constraint estimation formula, by using at least one information in the test difficulty calculation elements database in the means of memorizing among the relationship between netlist, the number of package pins, the number of test pins, an expected operational clock frequency, process technology information, a power consumption during test, and a tester storage space and by the DFT scheme stored in the means of memorizing as a test flow, and then setting at least one information in the test difficulty calculation elements database in the means of memorizing among the relationship between netlist, the number of package pins, the number of test pins, an expected operational clock frequency, process technology information, a power consumption during test, and a tester storage space, as a test constraint criterion;

(7) if all of the test constraint value for every test constraint estimation formula satisfies the test constraint criterion, then, for the relationship of the DFT scheme and the priority stored in the test flow database in the means of memorizing, sorting the DFT scheme in an order of the related priority, and then storing the sorted DFT scheme into the means of memorizing as a test flow as well as using the means of output to show the test flow;

(8) if any of the test constraint value for every test constraint estimation formula does not satisfy the test constraint criterion, then, using the means of output to show the unsatisfying test constraint value.

8-(2) Here, "a test constraint estimation formula" is a formula to calculate a test constraint value based on at least one DFT scheme and the value in the test difficulty calculation elements database.

"A test constraint value" represents the degree of constraints numerically, for each LSI test where individual DFT scheme is applied.

"A test constraint criterion" is a criterion used in order to determine if a specific "DFT scheme" should be applied or not, and/or if the value in the test difficulty calculation elements database should be corrected or not, based on the decision if a test constraint value calculated by a test constraint estimation formula satisfies the test constraint criterion or not.

8-(3) In this aspect of the present invention, it is checked if a test constraint value calculated for each test constraint estimation formula satisfies the test constraint criterion or not, and if satisfied, the test flow is output, and if not satisfied, unsatisfying test constraint value is output helping of re-input.

Therefore, it becomes possible for a user to adjust the test flow for generation and execution under existence of unsatisfying test constraint criteria, resulting in reduction of time and cost due to re-testing and so on.

In particular, since the user can be noticed which test constraint value causes a problem, the user can also obtain information how to correct the values in the test difficulty calculation elements database.

9-(1) As still another aspect with the present invention, in the computer program for producing test flow, the means of memorizing of the computer system may further store; at least one test constraint estimation formula in order to calculate a test constraint value based on at least one DFT scheme and the value in the test difficulty calculation elements database; and at least one test constraint criterion correction formula.

Then, the computer program for producing test flow may further utilize the means for processing to process the following three steps (6), (7), and (8):

(6) for each test constraint estimation formula in the means of memorizing, calculating a test constraint value based on the test constraint estimation formula, by using at least one information in the test difficulty calculation elements database in the means of memorizing among the relationship between netlist, the number of package pins, the number of test pins, an expected operational clock frequency, process technology information, a power consumption during test, and a tester storage space and by the DFT scheme stored in the means of memorizing as a test flow, and then setting at least one relationship in the test difficulty calculation elements database in the means of memorizing among the relationship between netlist, the number of package pins, the number of test pins, an expected operational clock frequency, process technology information, a power consumption during test, and a tester storage space, as a test constraint criterion;

(7) if all of the test constraint value for every test constraint estimation formula satisfies the test constraint criterion, then, for the relationship of the DFT scheme and the priority stored in the test flow database in the means of memorizing, sorting the DFT scheme in an order of the related priority, and then storing the sorted DFT scheme into the means of memorizing as a test flow as well as using the means of output to show the test flow;

(8) if any of the test constraint value for every test constraint estimation formula does not satisfy the test constraint criterion, then, for each unsatisfying test constraint criterion value among the test constraint criterion value, updating the corresponding value in the test difficulty calculation elements database based on the test constraint criterion correction formula in the means of memorizing, and re-processing the steps (1) to (7).

9-(2) "A test constraint criterion correction formula" is a calculating formula used to at least one value in the test difficulty calculation elements database, based on variables such as test constraint value and test constraint criterion.

"for each unsatisfying test constraint criterion value among the test constraint criterion value, update the corresponding value in the test difficulty calculation elements database based on the test constraint criterion correction formula in the means of memorizing" means that, regarding the unsatisfying test constraint criterion and the test constraint value as variables, and by the test constraint criterion correction equation, the value corresponding to the unsatisfying test constraint criterion is updated in the test difficulty calculation elements database.

9-(3) In this aspect of the present invention, it is checked if a test constraint value calculated for each test constraint estimation formula satisfies the test constraint criterion or not, and if satisfied, the test flow is output, and if not satisfied, for the unsatisfied test constraint criterion, the value corresponding to the unsatisfying test constraint criterion is updated in the test difficulty calculation elements database based on the test constraint criterion correction formula in the means of memorizing, and process is repeatedly performed.

Therefore, against generation and execution under existence of unsatisfying test constraint criteria it becomes possible to re-generate test flow until all test constraint criteria are satisfied without explicit modification of the user.

10-(1) As still another aspect with the present invention, in the computer program for producing test flow, the means of memorizing of the computer system may further store; a CAD tool specifying database comprising the relationship between the DFT scheme and a CAD tool; a CAD tool environmental constraint database; and at least one test constraint criterion correction formula.

Then, the computer program for producing test flow may further utilize the means for processing to process the following two steps (6) and (7):

(6) among the DFT scheme included in the CAD tool specifying database, adopting only the DFT scheme which is related to the CAD tool included in the CAD tool environmental constraint database in the means of memorizing as the DFT scheme included in the test flow stored in the means of the memorizing;

(7) for the DFT scheme which is not adopted as the one in the test flow, based on the test constraint criterion correction formula, updating information of the test difficulty calculation elements database of the means of memorizing, and re-process the steps (1) to (6).

10-(2) "For the DFT scheme which is not adopted as the one in the test flow, based on the test constraint criterion correction formula, update information of the test difficulty calculation elements database of the means of memorizing" means that, for the DFT scheme which is not adopted as the one in the test flow, a value in the test difficulty calculation elements database might be included as variable for the test difficulty calculation formula or the second test difficulty calculation formula in the record of the test menu database or the second test menu database, where the record determined the value as necessary, and thus this value is updated based on the test constraint criterion correction formula.

Here, as a variable given for the "test constraint criterion correction", there could be the test difficulty, the second test difficulty, as well as a value of test difficulty calculation elements database which are required as variable under the calculation of the test difficulty calculation formula or the second test difficulty calculation formula.

10-(3) In this aspect of the present invention, if there is the DFT scheme which is not related with the CAD tool included in the CAD tool environmental constraint database, then the DFT scheme is not included in the test flow, and then re-process is performed under the updated information of test difficulty calculation elements database according to test constraint criterion correction formula.

Therefore, such a test flow that is impossible to implement in the user's environment is not produced, and without explicit modification of the user, the test flow is re-generated until such a test flow is generated that can be actually applied in the user's environment.

Especially, since such a test flow that is impossible to implement in the user's environment is never produced, thus realistic test flow generation is realized, considering environments of individual users.

11-(1) Related with the above invention, the following is a supplemental explanation for the terms.

11-(2) The following is about general constraints on LSI design and test.

Netlist: A list obtained by logically-synthesizing the circuit description (RTL, in common), which is implemented by a designer. The number of gates, the number of FFs, the number of pins (primary input/output of the circuit) are determined.

Operational frequency: A clock frequency of the LSI, at which speed the LSI should guarantee its correct operation. For at-speed test, being a factor to determine clock frequency for the test.

At-speed: such as delay test and functional test; Being possibility of DFT circuit insertion. Delay of functional path in the circuit might be increased by DFT insertion. It is not allowed to unsatisfy the Operational frequency thereby.

Technology (process rule): Determined as a specification of a chip. Determining factor of chip size. For the same number of gates, advanced process can shrink the chip size. Determining factor of manufacturing cost.

Advanced process: manufacturing cost per area is large, and launch cost is also large Determining factor of fault model.

Advanced process: needs for performing delay test.

Package: Determined as a specification of a chip. Determines the total number of pins.

11-(3) The following parameters can be determined by a designer, in general.

The number of test pins: Usually, determined as the total number of pins—the number of functional pins. Determined from power and clock pins. There might be a case where functional pins can be reused as test pins during test. There might also be a case where pins are shared by test control pins (test-mode, scan-enable and so on), test-data-input, test-data-output, and input/output of test data. at minimum, five pins are enough for testing.

JTAG interface: input/output control commands and data sequentially (leading to much long test time).

The number of external input/output scan chains: The number of pins which are connected to scan chains and accessible from external input/output. When compression macro is not applied, equivalent to the number of internal scan chains. When compression macro is applied, being determining factor of compression rate. compression rate=the number of internal scan chains/the number of external input scan chains. Determining factor of test data volume.

The number of internal scan chains, length of internal scans: The number of internal scan chains: the number of the scan chains existing inside the circuit. Length of internal scans: maximum length of individual internal scan. The lengths of the scans might not be equal due to problems of distances between FFs. If all scan chains have the same length, then the number of FFs=the number of internal scan chains*length of internal scans. There might be a upper limit due to congestion of wiring. Distributed insertion of compression macro may improve the upper limit.

Fault model and fault coverage: Modeled faults targeted at automatic test pattern generation (ATPG), and objective coverage for the target faults. Well-known fault models are: stuck-at model and transition delay fault model.

Stuck-at fault model: Assume that a wire in a circuit is stuck at 0 or 1 due to a defect. Can be tested by low speed. Can achieve high fault coverage (such as 95%, 99%, and 100%) by ATPG. Very widely applied.

Transition delay fault model: Assume that signal transition delay occurs on a wire due to a defect. Require at-speed test. Difficulty on achieving high coverage. Difficulty on pattern generation. Possibility of massive increase of the number of the patterns. Required at advanced process (<90 nm).

Determining factor of the number of the test patterns: Precise number of test pattern only determined after ATPG generation. Determining factor of yield loss and field failure rate (test escape).
- yield loss: false identification of good chip as bad.
- field failure: false identification of bad chip as good.
- difficult to quantitative evaluation.

Test application time: Time required for a tester to execute the test patterns. Test application time=(1/test clock frequency)*(the number of test patterns+1)*L. The number of the clocks required to apply test patterns are Required clock for 1 pattern: length of internal scan+1 in case of stuck-at faults Scan-in data→operate one clock (pattern application)→scan-out Scan-out can be performed simultaneously with a next scan-in For delay test: length of internal scan+2

Require two clocks for pattern application, or shift one more clock→operate one clock. Due to need to apply double patterns continuously, at the delay test scan in/out can be performed at low-speed, while pattern application should be performed at-speed, then low-speed test can be applied but test application time increases.

Test Data Volume:

Total amount of test data (in bits), applied to a chip which is stored in a tester.

Determined from the number of patterns, the number of external scan chains, and the length of internal scans.

Test data volume=the number of patterns*((the number of external scan chains*length of internal scans)+(the number of external output scan chains*length of internal scans)) holds.

Input value and expected value has to be stored for each pattern

It might not be possible to store all data on tester memory (tester memory<data volume).

Additional load of test data→possibility of significant increase of test application time Compression macro Input data from external scan input is extracted into internal scans (input extraction).

Test response output from internal scans is compacted and then output to external scan pins (response compaction).

Can apply different compression ratios for input extraction and response compaction.

Determining factor of test data volume.

Compression can reduce test deter for single pattern.

High compression ratio→difficulty on ATPG generation→might introduce increased number of patterns.

Even for the same compression rate the efficiency might be different depending on EDA vendors (the number of patterns, coverage, hardware overead)

Add Company A's macro→ATPG generation by Company B's tool: may not be possible

Determining factor of chip size.

Compression macro: additional circuit.

Higher compression ration→larger additional circuit.

Target circuit :large→overhead becomes relatively small.

Determining factor of design and manufacturing cost.

Need to purchase license for applying compression macros. → available macros might be limited.

Chip Size:

Determined by the number of gates in the circuit, DFT overhead (FF→scan-FF, compression macro), and technology.

Precise chip size only determined by place & route.

Estimation: under the same technology, in proportion to the number of gates Determining factor of manufacturing cost.

Tester (Automatic Test Equipment: ATE):

Various parameters such as maximum operational frequency, amount of instrumented memory, and the number of pins If a tester is applicable for a test or not would be determined based on test data volume, test clock frequency, the number of pins, and so on.

Cost of tester application→determining factor of manufacturing cost.

Test cost per a chip=cost of tester application per one second*test application time (sec) holds.

As described above, by applying this invention, a consistent test flow can be obtained automatically, based on the test difficulty calculation elements database which is storing information about circuit design and is constructed by information generated by a circuit designer.

BRIEF DESCRIPTION OF THE DRAWINGS

For more thorough understanding of the present invention and advantages thereof, the following description should be read in conjunction with the accompanying drawings, in which.

DETAILED DESCRIPTION IN THE PREFERRED EMBODIMENTS

Figure 1:
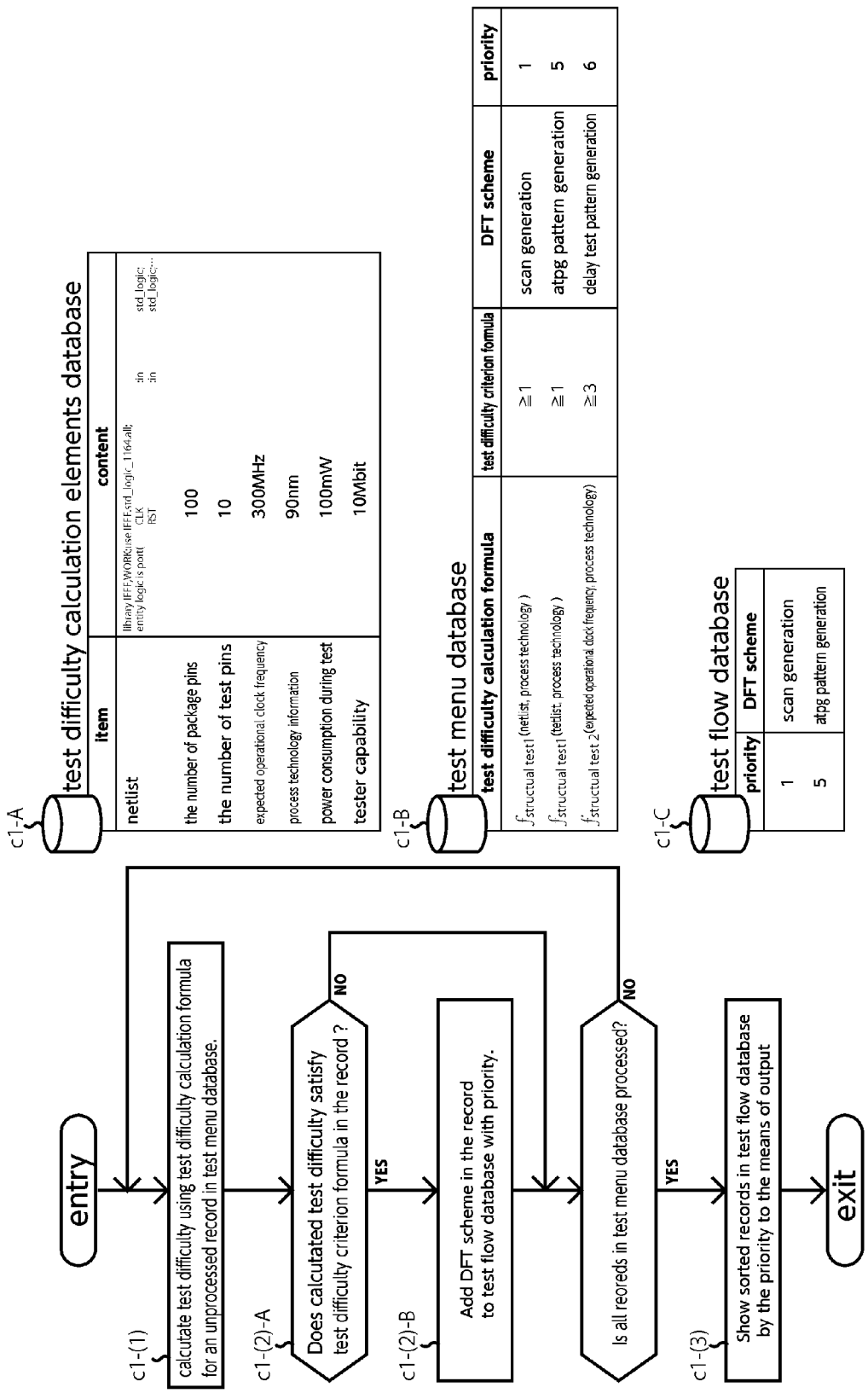
FIG. 1 is an example of a flow chart executed by the computer system for producing test flow in accordance with the present invention.

In the following an embodiment in accordance with the present invention is explained, referring to figures.

1. Composition of the Embodiment for the Invention (1) A computer system according to the present invention comprises; a means of output; a means of processing; a means of input; and a means of memorizing. Then, these means are connected electrically via a bus, and be able to transmit information (communication of signals) with each other.

The components of the computer system for producing test flow is explained in more detail.

The means of output is an output device to show information to a user of the computer system for producing test flow, and corresponds to a display device such as liquid crystal display and CRT, for example.

The means of processing is a processing device which operates to the other means (devices), and corresponds to CPU, for example.

The means of input is an input device that receive a command from the a user of the computer system for producing test flow, and corresponds to a keyboard and a mouse, for example.

The means of memorizing is a storage device to store massive information, as well as a memory device to store information which is target of operation by the means of processing, corresponding to a hard-disk drive (HDD) and main memory, for example.

The bus is a transmission link for the each means to communicate with each other.

A computer program for producing test flow according to the present invention can be executed even on a local computer system such as a personal computer, and thus under this condition the computer program is explained in the following.

On the other hand, the computer system according to the present invention might also comprises a plurality of computer systems.

For example, such a case that the system comprises a multiple computer system can be considered, as; a computer system at a client-side operates as the means of input as well as the means of output, another computer system at a server-side operates as the means of processing, where wide-area communication link like the Internet operates as the bus.

Next, various information stored in the HDD which is the means of memorizing of the computer system for producing test flow is explained.

The HDD as the means of memorizing stores a suite of databases, the computer program for producing test flow, and OS and other programs in forms of database and/or files.

The suit of databases comprises a test difficulty calculation elements database, a test menu database, a test flow database, a CAD tool specifying database, a CAD tool environmental constraint database, and a convert database.

In the suite of databases, more than one database for an identical form may exist. For example, a case where more than two test menu database exists can be possible, and then in the case so-called a second test menu database as well a third test menu database would exist.

Then, the CPU as the means of processing performs on interpreting and execution of the program and data, by reading information from the HDD as the means of memorizing into the memory as the means of memorizing.

Similarly, the CPU as the means of processing reads OS and the other programs as well as the computer program for producing test flow from the HDD as the means of memorizing into the memory as the means of memorizing and interprets and executes them, and then such a processes as showing an test flow is performed.

As mentioned above, while this embodiment is explained under the assumption that at the initial state all information is stored in the HDD as the means of memorizing, the execution, the invention can also be naturally carried out even if all information is stored in the memory as the means of memorizing at the initial state.

2. Flow of the Embodiment for the Invention

FIG. 1 shows an example of a flow chat that the computer program for producing test flow according to the present invention executes. The flow of the invention is explained according to the figure.

First, when receiving a command to generate a test flow via a mouse or a keyboard as the means of input, the CPU as the means of processing calculates a test difficulty for every test menu record in the test menu database, by using at least one information in the test difficulty calculation elements database in a HDD as the means of memorizing among the relationship between netlist, the number of package pins, the number of test pins, an expected operational clock frequency, process technology information, a power consumption during test, and a tester storage space.

In the flow of FIG. 1, the process C1-(1) corresponds to this step. In an example of test menu database C1-B, the netlist, the expected operational clock frequency, and the process technology information are regarded as the variables for the test difficulty calculation formula.

(2) Next, the CPU as the means of processing identifies all of the relationship between the DFT scheme and the priority which is related with the test difficulty criterion formula being satisfied by the calculated test difficulty, and storing the identified relationship between the DFT scheme and the priority into the test flow database in the HDD as the means of memorizing.

In the flow of FIG. 1, steps C1-(2)-A and C1-(2)-B correspond to this process. The steps of C1-(1), C1-(2)-A, and C1-(2)-B are performed for all the test menu records in the test menu database.

(3) Then, for the relationship between the DFT scheme and the priority in the test flow database in the means of memorizing, the CPU as the means of processing sorts the DFT scheme in an order of the related priority, storing the sorted DFT scheme into the HDD as the means of memorizing as a test flow, and then using the display device as the means of output to show the sorted DFT scheme as a test flow.

In the flow of FIG. 1, step C1-(3) corresponds to this process.

(4) That is, a test difficulty is calculated for every LSI test (that is, per DFT scheme and per test menu record) stored in a test menu record in the test menu database, based on a test difficulty calculation formula, by the test difficulty calculation elements database which is storing the circuit design information.

Next, the relationship of the DFT scheme and the priority corresponding to the test difficulty calculated for each test menu record in the test menu database is specified, and then is stored into the test flow database.

Then, the relationship of the DFT scheme and the priority in the test flow database is sorted in the order of the priority, so that the order is consistent as a test flow, and the sorted DFT scheme is stored in the means of memorizing, as well as being output by the means of output as a test flow.

As a result of the sequence of information processing under a collaboration of hardware resources, a consistent test flow can be obtained automatically, based on the test difficulty calculation elements database which is storing information about circuit design and is constructed by information generated by a circuit designer, whether each DFT scheme is necessary being determined by calculating the test difficulty and by evaluating with the test difficulty criterion formula, and then necessary DFT scheme being sorted in the order of the priority.

In FIG. 1, based on the test difficulty calculation elements database C1-A and the test menu database C1-B stored in the HDD as the means of memorizing, as a result of the process according to the present invention, the test flow database C1-C can be obtained.

3. Another Embodiment of the Invention

Figure 2:
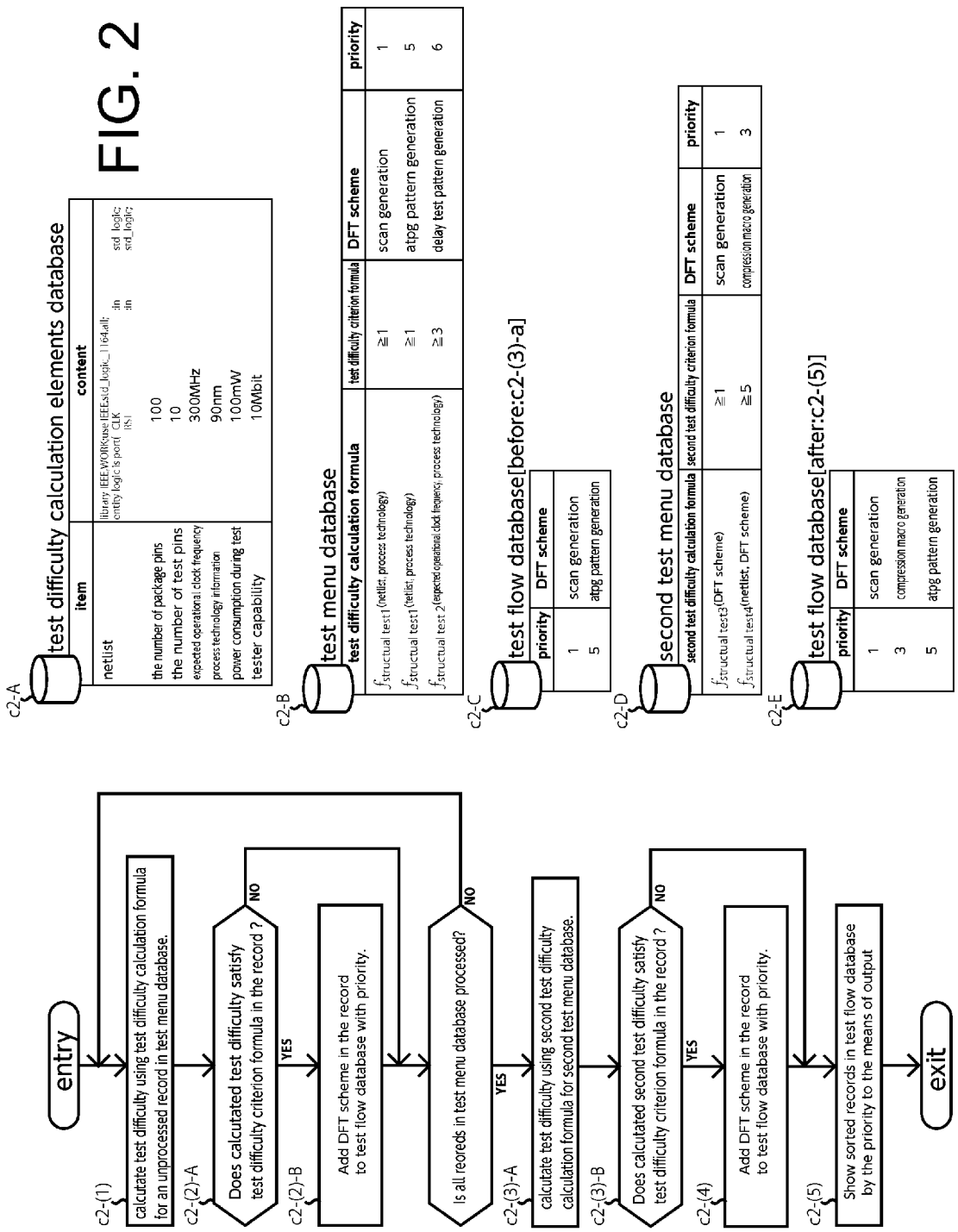
FIG. 2 is an example of a flow chart executed by the computer system for producing test flow in accordance with the present invention.

FIG. 2 shows an example of a flow chat that the computer program for producing test flow according to the present invention executes. The another flow of the invention is explained according to the figure.

In another embodiment of the invention, the HDD as the means of memorizing further stores a second test menu database comprising a relationship between, a second test difficulty calculating formula to calculate the test difficulty based on the value in the test difficulty calculation elements database and the DFT scheme, a test difficulty criterion formula, a DFT scheme, and a priority.

Then, the steps C2-(1), C2-(2)-A, and C2-(2)-B shown in FIG. 2, where these steps corresponds to C1-(1), C1-(2)-A, and C1-(2)-B in FIG. 1, are performed on the all test menu records in the test menu database. Thus, the flow is so far similar to FIG. 1.

(2) Next, the CPU as the means of processing calculates the second test difficulty based on the second test difficulty calculation formula of the second test menu database in the HDD as the means of memorizing, by using the DFT scheme stored in the test flow database in the means of memorizing and at least one relationship in the test difficulty calculation elements database in the means of memorizing among the relationship between the netlist, the number of package pins, the number of test pins, an expected operational clock frequency, process technology information, a power consumption during test, and a tester storage space.

In the flow of FIG. 2, step C2-(3)-A corresponds to this process.

(3) Then, the CPU as the means of processing identifies all of the relationship between the DFT scheme and the priority which is related with the second test difficulty criterion formula being satisfied by the calculated test difficulty from the second test menu database in the HDD as the means of memorizing, and then stores the identified relationship between the DFT scheme and the priority into the test flow database in the HDD as the means of memorizing.

In the flow of FIG. 2, steps C2-(3)-B and C2-(4) corresponds to this process.

(4) Further, for the relationship between the DFT scheme and the priority in the test flow database in the means of memorizing, the CPU as the means of processing sorts the DFT scheme in an order of the related priority, and then stores the sorted DFT scheme into the HDD as the means of memorizing as a test flow, and then uses the display device as the means of output to show the sorted DFT scheme as a test flow.

In the flow of FIG. 2, step C2-(5) corresponds to this process.

(5) As a result of this embodiment, a consistent test flow can be obtained automatically, based on the test difficulty calculation elements database which is storing information about circuit design and is constructed by information generated by a circuit designer, whether each DFT scheme is necessary being determined by calculating the test difficulty and by evaluating with the test difficulty criterion formula, and then necessary DFT scheme being sorted in the order of the priority.

Especially, a consistent test flow can be obtained automatically, based not only on the test difficulty calculation elements database which is storing information about circuit design but also on information of the DFT scheme which is determined as necessary, whether each DFT scheme is necessary being determined by calculating the second test difficulty and by evaluating with the test difficulty criterion formula, and then necessary DFT scheme being sorted in the order of the priority, resulting in more flexible test flow generation.

In FIG. 2, based on the test difficulty calculation elements database C2-A, the test menu database C2-B, and the second test menu database C2-D stored in the HDD as the means of memorizing, as a result of the process according to the present invention, the test flow database C2-E can be obtained.

4. Another Embodiment 2 of the Invention

Figure 3:
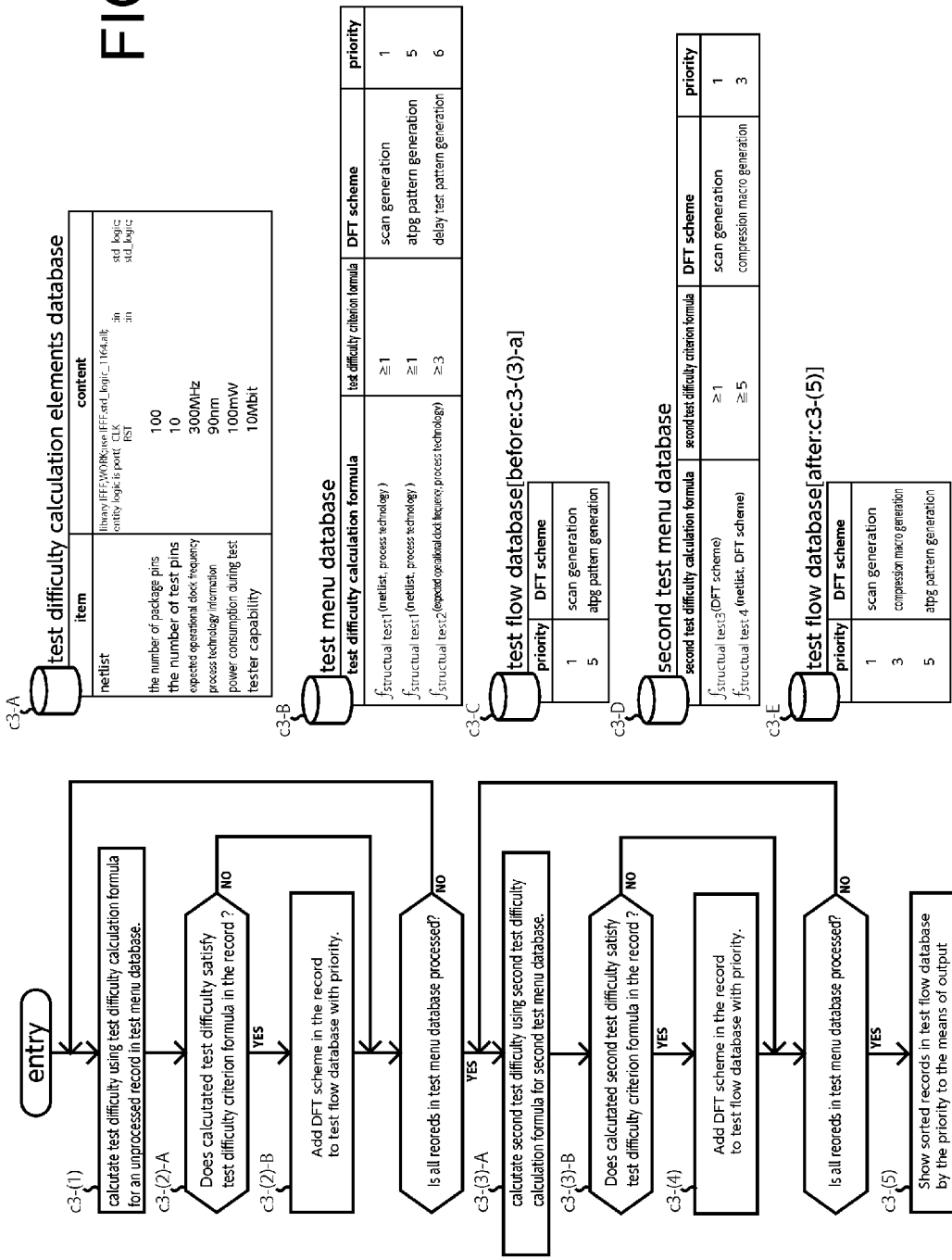
FIG. 3 is an example of a flow chart executed by the computer system for producing test flow in accordance with the present invention.

FIG. 3 shows an example of a flow chat that the computer program for producing test flow according to the present invention executes. The flow for another embodiment of the invention is explained according to the figure.

(1) In the another embodiment, the HDD as the means of memorizing may further store at least two second test menu records in the test menu database, and the CPU as the means of processing calculates the second test difficulty calculation process for each second test menu record, and performs storing process into the test flow database.

(2) The steps C3-(1), C3-(2)-A, and C3-(2)-B shown in FIG. 3, where these steps corresponds to C2-(1), C2-(2)-A, and C2-(2)-B in FIG. 2, are performed on the all test menu records in the test menu database. Thus, the flow is so far similar to FIG. 2.

Next, the steps C3-(3)-A, C3-(3)-B, and C3-(4) shown in FIG. 3, where these steps corresponds to C2-(3)-A, C2-(3)-B, and C2-(4) in FIG. 2, are performed on the all second test menu records in the second test menu database.

Then, the steps C3-(5) in FIG. 3, corresponding to C2-(5) in FIG. 2, is performed.

(3) As a result of this embodiment, a consistent test flow can be obtained automatically, based on the test difficulty calculation elements database which is storing information about circuit design and is constructed by information generated by a circuit designer, whether each DFT scheme is necessary being determined by calculating the test difficulty and by evaluating with the test difficulty criterion formula, and then necessary DFT scheme being sorted in the order of the priority.

Especially, a consistent test flow can be obtained automatically, based not only on the test difficulty calculation elements database which is storing information about circuit design but also on information of the DFT scheme which is determined as necessary, whether each DFT scheme is necessary being determined by calculating the second test difficulty and by evaluating with the test difficulty criterion formula, and then necessary DFT scheme being sorted in the order of the priority, resulting in more flexible test flow generation.

In FIG. 3, based on the test difficulty calculation elements database C3-A, the test menu database C3-B, and the second test menu database C3-D stored in the HDD as the means of memorizing, as a result of the process according to the present invention, the test flow database C3-E can be obtained.

5. Another Embodiment 3 of the Invention

Figure 4:
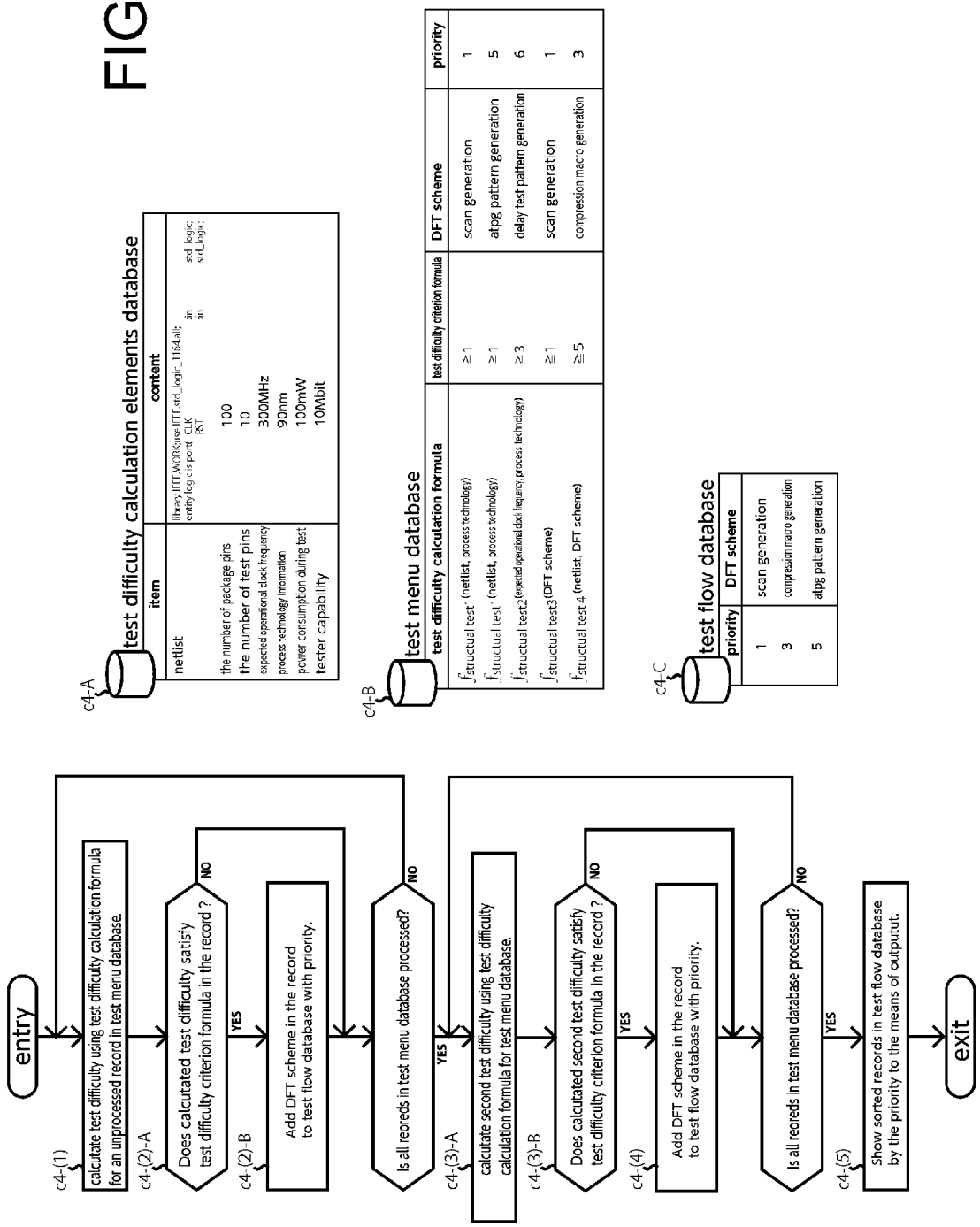
FIG. 4 is an example of a flow chart executed by the computer system for producing test flow in accordance with the present invention.

FIG. 4 shows an example of a flow chat that the computer program for producing test flow according to the present invention executes. The flow for another embodiment of the invention is explained according to the figure.

(1) In the another embodiment, the test menu database in the HDD as the means of memorizing may comprise at least two test menu records, wherein the test menu record is a relationship between a test difficulty calculation formula to calculate a test difficulty based on a value in the test difficulty calculation elements database, a test difficulty criterion formula, a DFT scheme, and a priority.

(2) Then, at the process of calculation of the second test difficulty, the CPU as the means of processing calculates the second test difficulty by using the DFT scheme stored in the test flow database in the HDD as the means of memorizing and at least one relationship in the test difficulty calculation elements database in the means of memorizing among the relationship between the netlist, the number of package pins, the number of test pins, an expected operational clock frequency, process technology information, a power consumption during test, and a tester storage space.

(3) The steps C4-(1), C4-(2)-A, and C4-(2)-B shown in FIG. 4, where these steps corresponds to C3-(1), C3-(2)-A, and C3-(2)-B in FIG. 3, are performed on the all test menu records in the test menu database. Thus, the flow is so far similar to FIG. 3.

Next, the steps C4-(3)-A, C4-(3)-B, and C4-(4) shown in FIG. 4, where these steps corresponds to C3-(3)-A, C3-(3)-B, and C3-(4) in FIG. 3, are performed on the all test menu records in the second test menu database.

Then, the steps C4-(5) in FIG. 4, corresponding to C3-(5) in FIG. 3, is performed.

(4) As the result of this embodiment, a consistent test flow can be obtained automatically, based on the test difficulty calculation elements database which is storing information about circuit design and is constructed by information generated by a circuit designer, whether each DFT scheme is necessary being determined by calculating the test difficulty and by evaluating with the test difficulty criterion formula, and then necessary DFT scheme being sorted in the order of the priority.

Especially, at a stage that the test flow database is storing no DFT schemes a test flow can be generated based on the test difficulty calculation elements database which is storing information about circuit design, and at a stage that the test flow database is storing DFT schemes a test flow can be generated based on the test difficulty calculation elements database which is storing information about circuit design as well as based on the DFT scheme stored in the test flow database.

Thus, even a single test menu database is enough for flexible and detailed setting if the test menu database comprises a plurality of the records.

(5) In FIG. 4, based on the test difficulty calculation elements database C4-A and the test menu database C4-B stored in the HDD as the means of memorizing, as a result of the process according to the present invention, the test flow database C4-C can be obtained.

6. Another Embodiment 4 of the Invention

Figure 5:
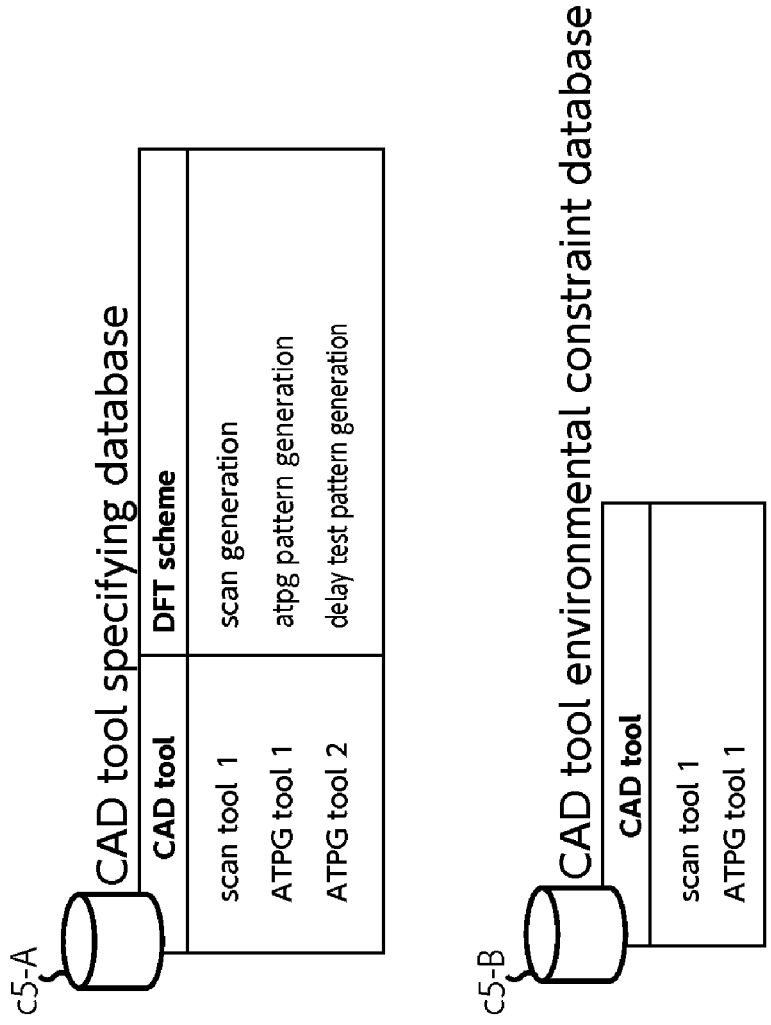
FIG. 5 is an example of a database utilized by the computer system for producing test flow in accordance with the present invention.

FIG. 5 shows an example of a database that the computer program for producing test flow according to the present invention executes. The flow for another embodiment of the invention is explained according to the figure.

(1) In the another embodiment, the HDD as the means of memorizing of the computer system further stores; a CAD tool specifying database comprising the relationship between the DFT scheme and a CAD tool; and a CAD tool environmental constraint database which stores at least one CAD tool.

(2) Then, among the DFT scheme included in the CAD tool specifying database in the HDD as the means of memorizing, the CPU as the means of processing adopts only the DFT scheme which is related to the CAD tool included in the CAD tool environmental constraint database in the HDD as the means of memorizing as the DFT scheme included in the test flow stored in the means of the memorizing.

(3) As a result of this embodiment, if a user of the computer system inputs the environmental constraint on the CAD tool software into the CAD tool environmental constraint database in advance, only the DFT scheme which corresponds to available CAD tool software is adopted as a test flow.

Accordingly, such a test flow that is impossible to implement in the user's environment is not produced, and thus realistic test flow generation is realized, considering environments of individual users.

(4) In FIG. 5, based on the CAD tool specifying database C5-A and the CAD tool environmental constraint database C4-B stored in the HDD as the means of memorizing, as a result of the process according to the present invention, the DFT schemes "Scan generation" and "ATPG generation" can be adopted to the test flow, because the corresponding CAD tools, "Scan tool 1" and "ATPG tool 1" are specified, respectively, and also environmental constraint is satisfied. On the other hand, the DFT scheme "Delay test generation" is not be adopted, since environmental constraint is not satisfied although the CAD tool "ATPG tool 2" can be specified.

7. Another Embodiment 5 of the Invention

Figure 6:
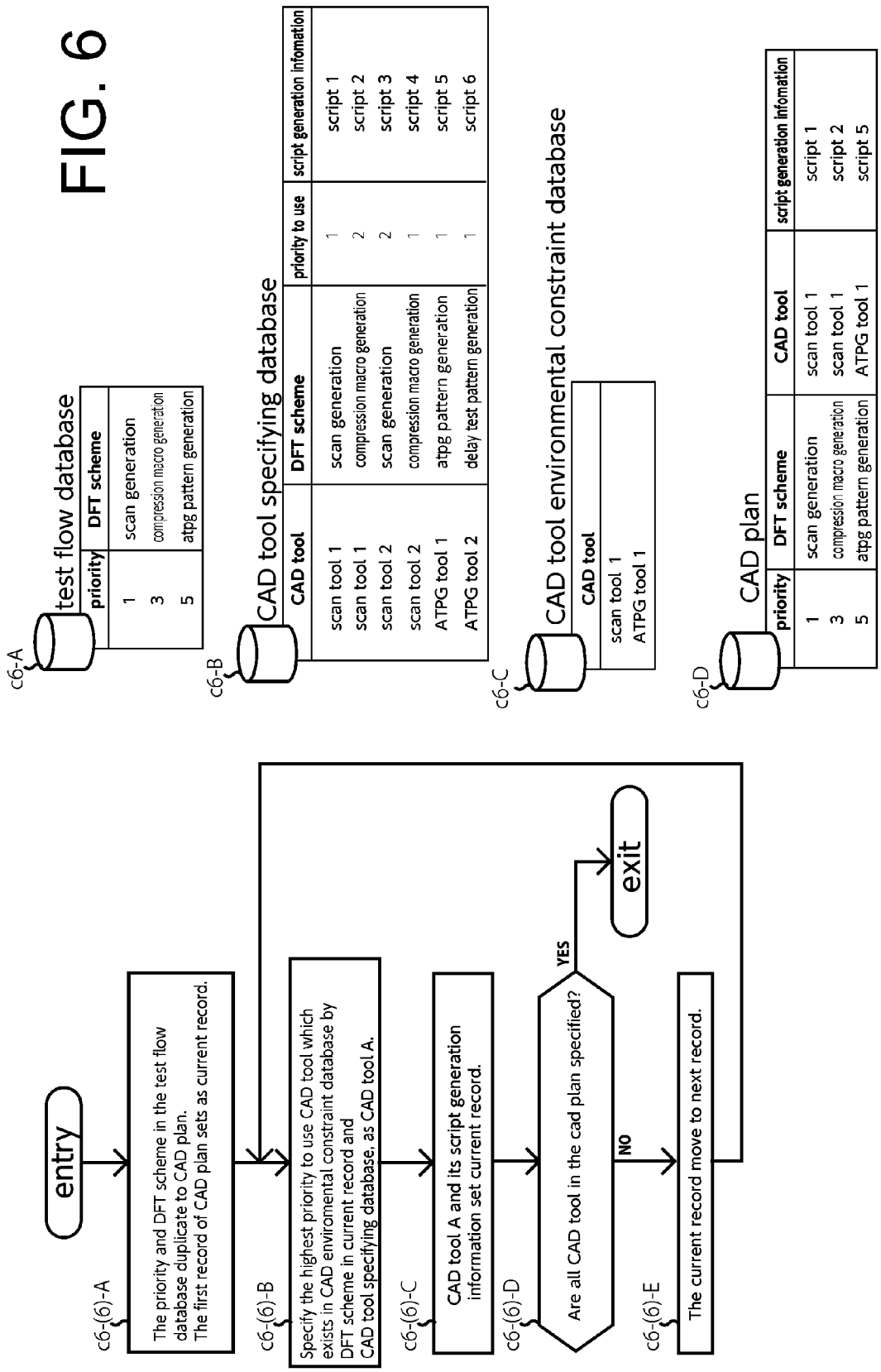
FIG. 6 is an example of a flow chart executed by the computer system for producing test flow in accordance with the present invention.

FIG. 6 shows an example of a flow chart that the computer program for producing test flow according to the present invention executes. The flow for another embodiment of the invention is explained according to the figure.

(1) In the another embodiment, the HDD as the means of memorizing of the computer system further stores; a CAD tool specifying database comprising the relationship between the DFT scheme, a CAD tool, an usage priority, and a script generation information; and a CAD tool environmental constraint database which stores at least one CAD tool.

(2) Then, the CPU as the means of processing force the following process for each DFT scheme stored in the HDD as the means of memorizing as the test flow, and then produces a CAD plan considering an order of the DFT scheme stored in the HDD as the means of memorizing as the test flow Specifically, among the CAD tools included in the CAD tool environmental constraint database in the HDD as the means of memorizing, the CPU as the means of processing specifies the one relating with the DFT scheme in the CAD tool specifying database in the HDD as the means of memorizing and having highest value in terms of the related usage priority, and relates the specified CAD tool and the script generation information to the DFT scheme, and then stores them into the HDD as the means of memorizing as the CAD plan.

(3) The steps C6-(6)-A, C6-(6)-B, C6-(6)-C, C6-(6)-D and C6-(6)-E in FIG. 6 correspond to this process.

The steps C6-(6)-B, C6-(6)-C, C6-(6)-D and C6-(6)-E are repeated until CAD tool and script generation information is specified for all DFT scheme of the CAD plan.

It might also be possible that, if the CAD tool environmental constraint database has no CAD tool corresponding to the DFT scheme in the test flow database, then CAD tool and script generation information in the CAD plan would be processed as blank.

As a result of this embodiment, if a user of the computer system inputs the environmental constraint on the CAD tool software into the CAD tool environmental constraint database in advance, only the DFT scheme which corresponds to available CAD tool software is adopted as a test flow. Accordingly, such a test flow that is impossible to implement in the user's environment is not produced, and thus realistic test flow generation is realized, considering environments of individual users.

Especially, since a script is produced considering the order of DFT scheme as the test flow based on the script generation information, the CAD plan which is immediately executable on the CAD tool can be obtained.

Furthermore, it is not necessary that the user specifically select the CAD tool to implement each DFT scheme, instead appropriate CAD tool corresponding to the user's environment is already selected in the obtained CAD plan.

(5) In FIG. 6, based on the test flow database C6-A, the CAD tool specifying database C6-B, and the CAD tool environmental constraint database C6-C stored in the HDD as the means of memorizing, as a result of the process according to the present invention, the CAD plan C6-D can be obtained.

For each DFT scheme, the CAD tool which exists in the CAD tool environmental database as well as which has higher priority is adopted.

8. Another Embodiment 6 of the Invention

Figure 7:
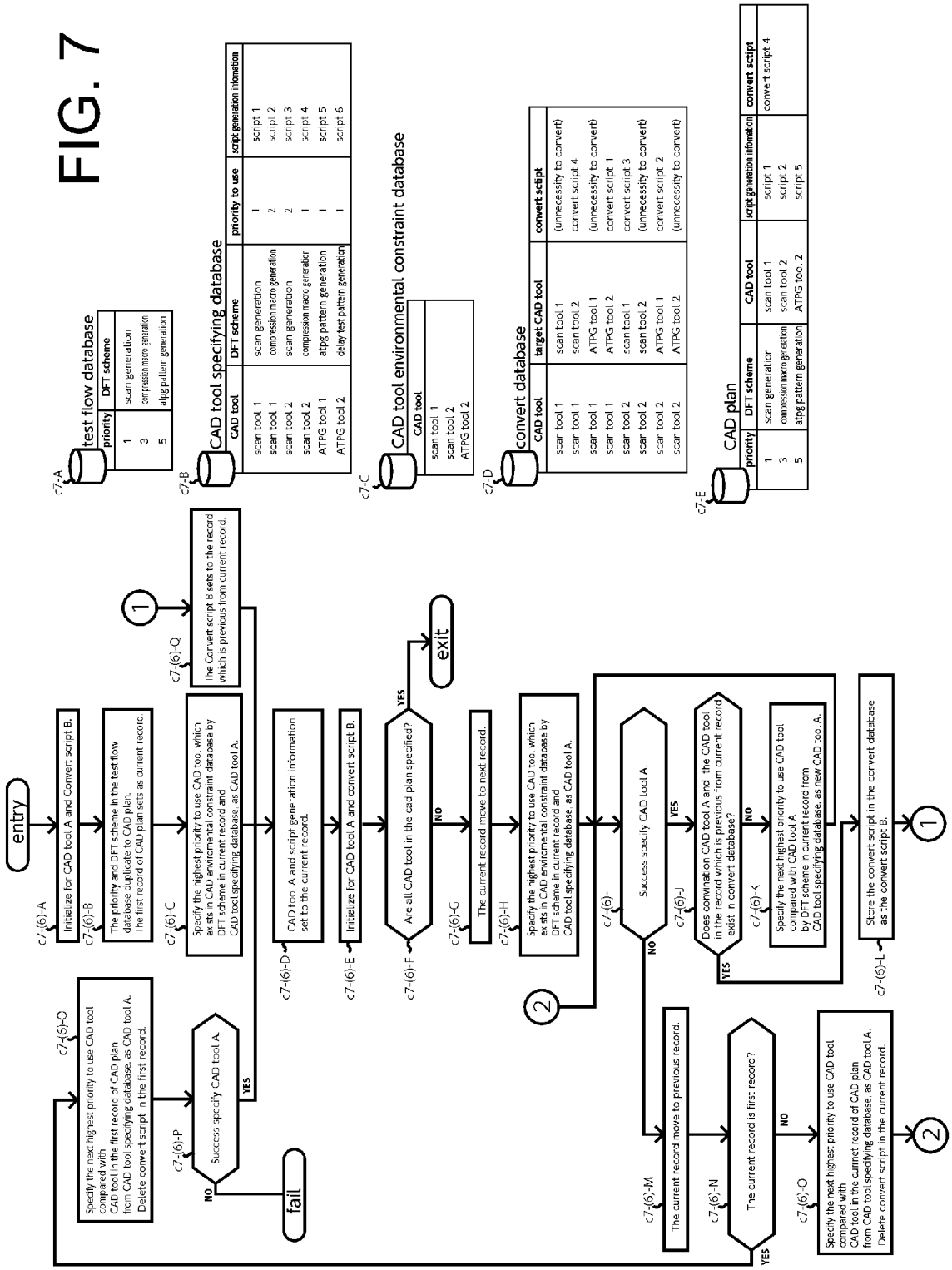
FIG. 7 is an example of a flow chart executed by the computer system for producing test flow in accordance with the present invention.

FIG. 7 shows an example of a flow chart that the computer program for producing test flow according to the present invention executes. The flow for another embodiment of the invention is explained according to the figure.

(1) In the another embodiment, the HDD as the means of memorizing of the computer system may further store; a CAD tool specifying database comprising the relationship between the DFT scheme, a CAD tool, an usage priority, and a script generation information; a convert database comprising the relations of a convert scheme information and a CAD tool flow which relates two or more CAD tools; and a CAD tool environmental constraint database which stores at least one CAD tool.

(2) Then, for each DFT schemes stored in the HDD as the means of memorizing as the test flow, among the CAD tools included in the CAD tool environmental constraint database in the HDD as the means of memorizing, the CPU as the means of processing specifies the one relating with the DFT scheme in the CAD tool specifying database in the HDD as the means of memorizing and having highest value in terms of the related usage priority, relates the specified CAD tool and the script generation information to the DFT scheme, and then stores them into the HDD as the means of memorizing, and then produces a CAD plan considering an order of the DFT schemes stored in the HDD as the means of memorizing as test flow.

(3) Further, based on the order of the CAD tool stored in the HDD as means of memorizing as the CAD plan, the CPU as the means of processing specifies the CAD tool flow corresponding to the order of the CAD tool among the convert database in the HDD as the means of memorizing, and then, based on a convert scheme information which is relating with the specified CAD tool flow, relating and inserting the convert script along with the order of the CAD tool, then store as the CAD plan in the HDD as the means of memorizing.

(4) The steps C7-(6)-A, C7-(6)-B, C7-(6)-C, C7-(6)-D, C7-(6)-E, C7-(6)-F, C7-(6)-G, and C7-(6)-H in FIG. 7 correspond to this process.

The steps C7-(6)-I, C7-(6)-J, C7-(6)-K, C7-(6)-L, C7-(6)-M, C7-(6)-N, C7-(6)-O, C7-(6)-P and C7-(6)-Q in FIG. 7 is a flow considering the case where the CAD tool flow which corresponds to the order of the CAD tool in the CAD plan does not exist in the convert database.

That is, assume the case where one only has a convert script which converts a data from the CAD tool for a company A's DFT 1 into another CAD tool for company B's DFT2, while the one does not have a convert tool from the CAD tool for company A's DFT1 to a CAD tool for company C's DFT 2. In this case, only a convert script (convert scheme information) from A to B is in the convert database.

Then, for the situation where the CAD plan already selects A's CAD tool for the DFT scheme DFT 1, when only the CAD tool specifying database, the convert database indicates that even if the company C's CAD tool is selected for DFT2 there is no way to convert the data from A's CAD tool to B's CAD tool.

Therefore, it is required to re-select C's CAD tool for DFT1, not A's in the CAD plan. Thus, the combination of the CAD tools, the CAD tool flow sometimes does not exist, and the process of checking whether CAD tool A is specified is performed at C7-(6)-I and C7-(6)-P.

(5) As a result of this embodiment, after a user of the computer system inputs the convert database comprising the relationship of CAD tool flow and convert script, the convert script is inserted according to the order of CAD tool in the CAD plan, if the order of the CAD tool as the CAD plan requires the execution of the convert script.

Accordingly, even for the case that the test flow is executed on multiple different CAD tools, the user can generate a CAD plan without worrying about the difference of CAD tool environment.

(6) In FIG. 7, based on the test flow database C7-A, the CAD tool specifying database C7-B, the CAD tool environmental constraint database C7-C, and convert database C7-D stored in the HDD as the means of memorizing, as a result of the process according to the present invention, the CAD plan C7-D can be obtained.

9. Another Embodiment 7 of the Invention

Figure 8:
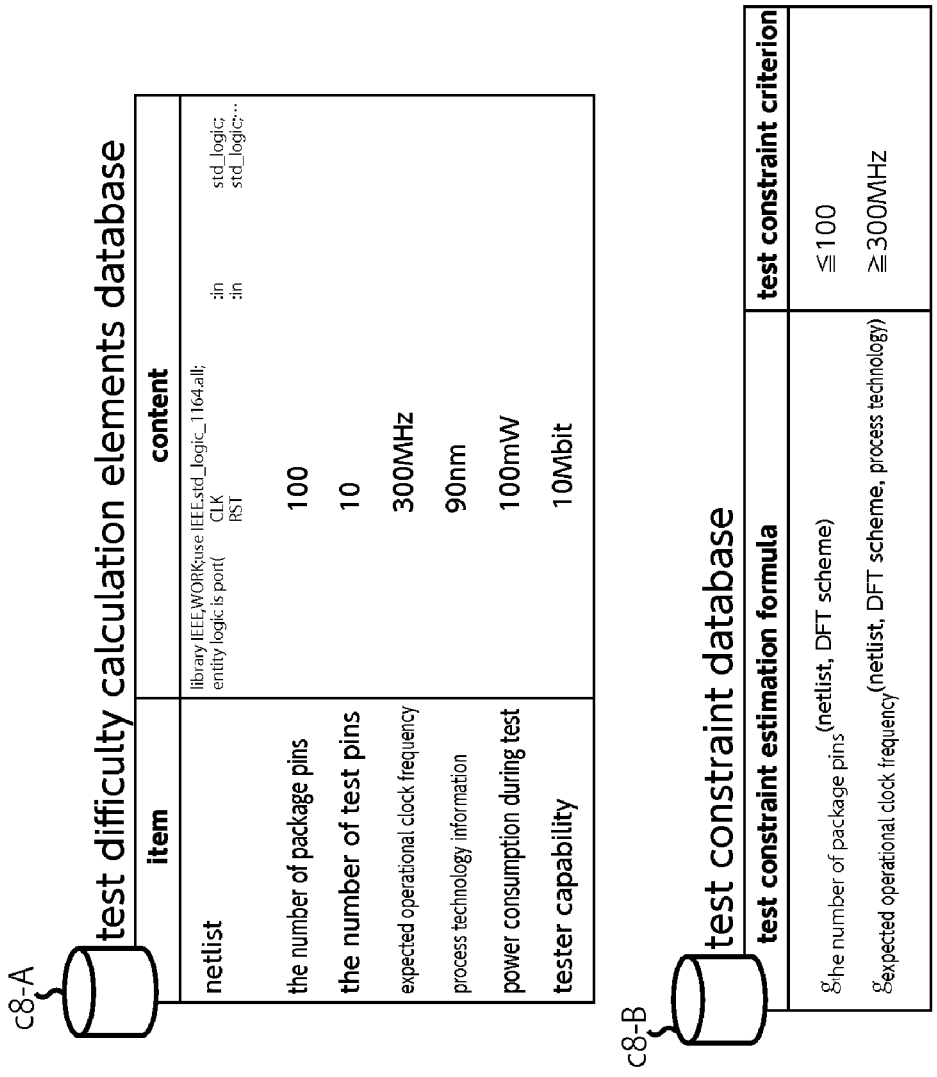
FIG. 8 is an example of a flow chart executed by the computer system for producing test flow in accordance with the present invention.

FIG. 8 shows an example of a database that the computer program for producing test flow according to the present invention executes. The flow for another embodiment of the invention is explained according to the figure.

(1) In the another embodiment, the HDD as the means of memorizing of the computer system may further store at least one test constraint estimation formula in order to calculate a test constraint value based on at least one DFT scheme and the value in the test difficulty calculation elements database.

(2) Then, for each test constraint estimation formula in the HDD as the means of memorizing, the CPU as the means of processing calculates a test constraint value based on the test constraint estimation formula, by using at least one information in the test difficulty calculation elements database in the means of memorizing among the relationship between netlist, the number of package pins, the number of test pins, an expected operational clock frequency, process technology information, a power consumption during test, and a tester storage space and by the DFT scheme stored in the HDD as the means of memorizing as a test flow, and then sets at least one relationship in the test difficulty calculation elements database in the means of memorizing among the relationship between netlist, the number of package pins, the number of test pins, an expected operational clock frequency, process technology information, a power consumption during test, and a tester storage space, as a test constraint criterion.

(3) Next, if all of the test constraint value for every test constraint estimation formula satisfies the test constraint criterion, then, for the relationship of the DFT scheme and the priority stored in the test flow database in the HDD as the means of memorizing, the CPU as the means of processing sorts the DFT scheme in an order of the related priority, and then stores the sorted DFT scheme into the HDD as the means of memorizing as a test flow, and further uses the display device as the means of output to show the test flow.

(4) If any of the test constraint value for every test constraint estimation formula does not satisfy the test constraint criterion, then, the CPU as the means of processing uses the display device as the means of output to show the unsatisfying test constraint value.

(5) As a result of this embodiment, it is checked if a test constraint value calculated for each test constraint estimation formula satisfies the test constraint criterion or not, and if satisfied, the test flow is output, and if not satisfied, unsatisfying test constraint value is output helping of re-input.

Therefore, it becomes possible for a user to adjust the test flow for generation and execution under existence of unsatisfying test constraint criteria, resulting in reduction of time and cost due to re-testing and so on.

In particular, since the user can be noticed which test constraint value causes a problem, the user can also obtain information how to correct the values in the test difficulty calculation elements database.

In FIG. 8, based on the test difficulty calculation elements database C8-A and the test constraint database C8-D stored in the HDD as the means of memorizing, as a result of the process according to the present invention, whether the test constraint value for each test constraint estimation formula satisfies the test constraint criterion is checked, and if satisfied the test flow is shown, and if not satisfied, then the unsatisfied test constraint value is shown.

10. Another Embodiment 8 of the Invention (1) In another embodiment, the HDD as the means of memorizing of the computer system may further store; at least one test constraint estimation formula in order to calculate a test constraint value based on at least one DFT scheme and the value in the test difficulty calculation elements database; and at least one test constraint criterion correction formula.

(2) Then, for each test constraint estimation formula in the HDD as the means of memorizing, the CPU as the means of processing calculates a test constraint value based on the test constraint estimation formula, by using at least one information in the test difficulty calculation elements database in the HDD as the means of memorizing among the relationship between netlist, the number of package pins, the number of test pins, an expected operational clock frequency, process technology information, a power consumption during test, and a tester storage space and by the DFT scheme stored in the means of memorizing as a test flow, and then sets at least one relationship in the test difficulty calculation elements database in the HDD as the means of memorizing among the relationship between netlist, the number of package pins, the number of test pins, an expected operational clock frequency, process technology information, a power consumption during test, and a tester storage space, as a test constraint criterion.

(3) Next, if all of the test constraint value for every test constraint estimation formula satisfies the test constraint criterion, then, for the relationship of the DFT scheme and the priority stored in the test flow database in the HDD as the means of memorizing, the CPU as the means of processing sorts the DFT scheme in an order of the related priority, and then stores the sorted DFT scheme into the HDD as the means of memorizing as a test flow, and then uses the display device as the means of output to show the test flow.

(4) Then, if any of the test constraint value for every test constraint estimation formula does not satisfy the test constraint criterion, then, for each unsatisfying test constraint criterion value among the test constraint criterion value, the CPU as the means of processing updates the corresponding value in the test difficulty calculation elements database based on the test constraint criterion correction formula in the HDD as the means of memorizing, and repeatedly processes for producing test flow.

As a result of this embodiment, it is checked if a test constraint value calculated for each test constraint estimation formula satisfies the test constraint criterion or not, and if satisfied, the test flow is output, and if not satisfied, for the unsatisfied test constraint criterion, the value corresponding to the unsatisfying test constraint criterion is updated in the test difficulty calculation elements database based on the test constraint criterion correction formula in the means of memorizing, and process is repeatedly performed.

Therefore, against generation and execution under existence of unsatisfying test constraint criteria it becomes possible to re-generate test flow until all test constraint criteria are satisfied without explicit modification of the user.

11. Another Embodiment 9 of the Invention

Figure 9:
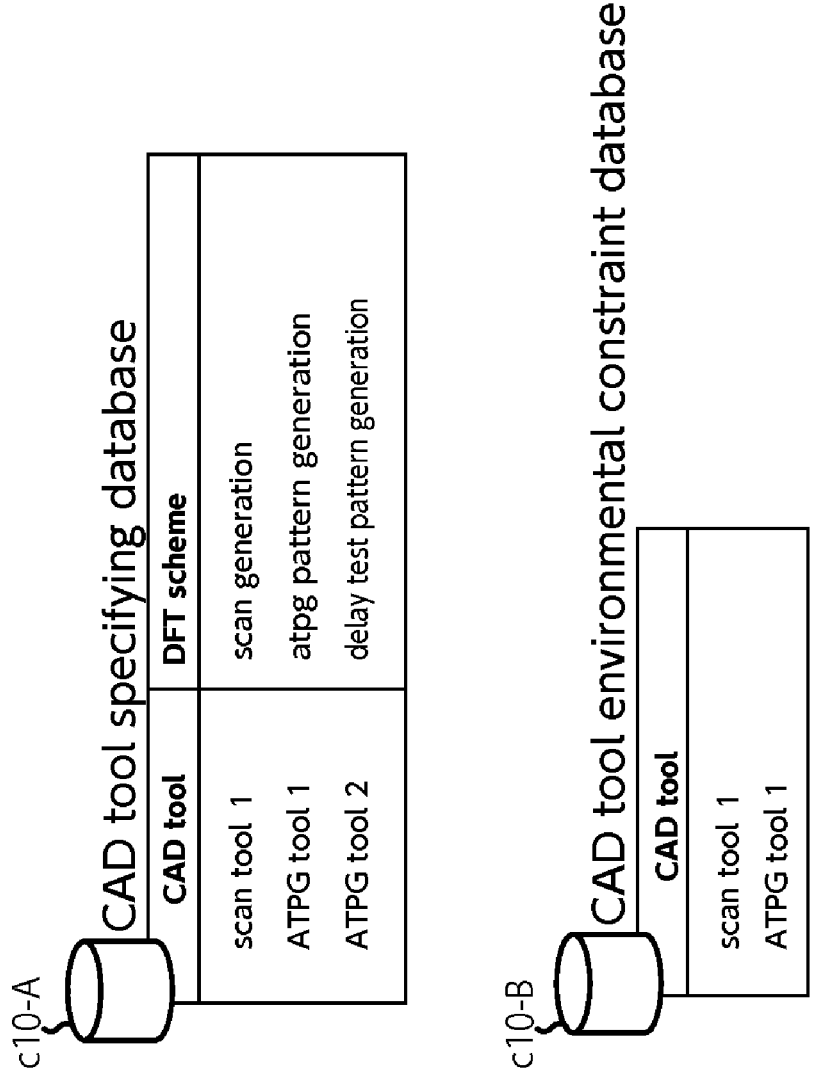
FIG. 9 is an example of a flow chart executed by the computer system for producing test flow in accordance with the present invention.

FIG. 9 shows an example of a database that the computer program for producing test flow according to the present invention executes. The flow for another embodiment of the invention is explained according to the figure.

(1) In the another embodiment, the HDD as the means of memorizing of the computer system may further store; a CAD tool specifying database comprising the relationship between the DFT scheme and a CAD tool; a CAD tool environmental constraint database which stores at least one CAD tool; and at least one test constraint criterion correction formula.

(2) Then, among the DFT scheme included in the CAD tool specifying database in the HDD as the means of memorizing, the CPU as the means of processing adopts only the DFT scheme which is related to the CAD tool included in the CAD tool environmental constraint database in the HDD as the means of memorizing as the DFT scheme included in the test flow stored in the HDD as the means of the memorizing.

(3) Next, for the DFT scheme which is not adopted as the one in the test flow, based on the test constraint criterion correction formula, the CPU as the means of processing updates information of the test difficulty calculation elements database of the HDD as the means of memorizing, and repeatedly processes for producing test flow.

(4) As a result of this embodiment, if there is the DFT scheme which is not related with the CAD tool included in the CAD tool environmental constraint database, then the DFT scheme is not included in the test flow, and then re-process is performed under the updated information of test difficulty calculation elements database according to test constraint criterion correction formula.

Therefore, such a test flow that is impossible to implement in the user's environment is not produced, and without explicit modification of the user, the test flow is re-generated until such a test flow is generated that can be actually applied in the user's environment.

Especially, since such a test flow that is impossible to implement in the user's environment is never produced, thus realistic test flow generation is realized, considering environments of individual users.

In FIG. 9, based on the CAD tool specifying database C10-A and the CAD tool environmental constraint database C10-B stored in the HDD as the means of memorizing, as a result of the process according to the present invention, only the DFT schemes corresponding to the CAD tool included in the CAD tool environmental constraint database is adopted as the DFT scheme of the tests flow, then information in the test difficulty calculation elements database is updated based on the test constraint criterion correction formula, and further the process is repeated.

Development and sales of the computer program and the computer system according to the invention could contribute to growth of industry.

The above embodiments of the present invention are simply for facilitating the understanding of the present invention and are not in any way to be construed as limiting the present invention. The present invention may variously be changed or altered without departing from its spirit and encompass equivalents thereof.

What is claimed is:

1. A computer program stored on a memory of a computer system and executed on the computer system,
the computer program providing a test flow for assisting production of a large-scale integrated (LSI) circuit test flow,
the computer system including a storage unit configured to store information, a processing unit configured to process information, an output unit configured to output the information for a user, and an input unit configured to be inputted with a command from the user, wherein the storage unit stores:
a test difficulty calculation elements database including the information indicative of relationship among netlist which denotes a logically synthesized LSI circuit description,
a number of package pins which denotes a number of pins supplied by a package,
a number of test pins which denote a number of pins for an LSI circuit test,
an expected operational clock frequency which denotes a clock frequency of the LSI circuit test,
process technology information which denotes information about ability of an LSI circuit manufacturing facility and characteristic of manufactured LSI circuits,
a power consumption during test which denotes a power consumed during the LSI circuit test, and
a tester storage space which denotes a size of memory of a tester for the LSI circuit test;
a test menu database including at least two test menu records each indicative of relationship among a test difficulty calculation formula to calculate a test difficulty based on a value in the test difficulty calculation elements database,
a test difficulty criterion formula,
a design-for-testability scheme, and a priority; and
a test flow database including at least one piece of information indicative of a relationship between the design-for-testability scheme and the priority, wherein
for each test menu record included in the test menu database stored in the storage unit, the computer program causes the processing unit to execute steps of:
(1) calculating a test difficulty for each test menu record in the test menu database, based on the test difficulty calculation formula, by using at least one piece of information among pieces of information indicative of relationship among the netlist, the number of package pins, the number of test pins, the expected operational clock frequency, the process technology information, the power consumption during test, and the tester storage space, in the test difficulty calculation elements database in the storage unit;
(2) identifying all relationships between the design-for-testability scheme and the priority, which are related to the test difficulty criterion formula met by the calculated test difficulty, from the test menu record in the test menu database, and causing the storage unit to store information indicative of the identified relationship between the design-for-testability scheme and the priority into the test flow database; and
(3) sorting the design-for-testability scheme in an order of the related priority based on the relationship between the design-for-testability scheme and the priority in the test flow database in the storage unit, causing the storage unit to store the sorted design-for-testability scheme as a test flow, and causing the output unit to output the test flow to be provided.

2. The computer program according to claim 1, wherein, the storage unit further stores:
a computer-aided design tool specifying database including information indicative of relationship between the design-for-testability scheme and a computer-aided design tool; and
a computer-aided design tool environmental constraint database including at least one piece of information indicative of the computer-aided design tool, and wherein
the computer program causes the processing unit to further execute a step of:

(4) adopting only a design-for-testability scheme as the test flow, which is related to the computer-aided design tool in the computer-aided design tool environmental constraint database, among the design-for-testability schemes in the computer-aided design tool specifying database stored in the storage unit.

3. The computer program according to claim 1, wherein the storage unit further stores:
a computer-aided design tool specifying database including information indicative of relationship among the design-for-testability scheme,
a computer-aided design tool,
an usage priority, and a script generation information; and
a computer-aided design tool environmental constraint database including at least one computer-aided design tool, and wherein
for each design-for-testability scheme as the test flow in the storage unit, the computer program causes the processing unit to further execute a step of:
(4) specifying a computer-aided design tool, which is related to the design-for-testability scheme in the computer-aided design tool specifying database and which has the highest value of the related usage priority, among the computer-aided design tools in the computer-aided design tool environmental constraint database in the storage unit, specifying a script generation information related to the specified computer-aided design tool, and causing the storage unit to store the specified computer-aided design tool and script generation information related to the design-for-testability scheme as a computer-aided design plan, in order to produce the computer-aided design plan in an order of the design-for-testability scheme stored in the storage unit as the test flow.

4. The computer program according to claim 1, wherein the storage unit further stores:
a computer-aided design tool specifying database including information indicative of relationship among the design-for-testability scheme, a computer-aided design tool, an usage priority, and a script generation information;
a convert database including information indicative of relationship between a convert scheme information and a computer-aided design tool flow obtained by relating two or more computer-aided design tools to one another; and
a computer-aided design tool environmental constraint database including at least one computer-aided design tool, and wherein the computer program causes the processing unit to execute steps of:
(4) for each design-for-testability scheme as the test flow in the storage unit, specifying a computer-aided design tool, which is related to the design-for-testability scheme in the computer-aided design tool specifying database and which has the highest value of the related usage priority, among the computer-aided design tools in the computer-aided design tool environmental constraint database in the storage unit, specifying a script generation information related to the specified computer-aided design tool, causing the storage unit to store the specified computer-aided design tool and script generation information related to the design-for-testability scheme as a computer-aided design plan, and producing the computer-aided design plan in an order of the design-for-testability scheme stored in the storage unit as the test flow;
(5) based on the order of the computer-aided design tool stored in the storage unit as the computer-aided design plan, specifying the computer-aided design tool flow corresponding to the order of the computer-aided design tool among the convert database in the storage unit, and based on a convert scheme information related to the specified computer-aided design tool flow, relating and inserting the convert script along with the order of the computer-aided design tool, and thereafter causing the storage unit to store a result into the computer-aided design plan.

5. The computer program according to claim 1, wherein the storage unit further stores:
at least one test constraint estimation formula in order to calculate a test constraint value based on at least one design-for-testability scheme and the value in the test difficulty calculation elements database, and wherein
the computer program causes the processing unit to further execute steps of:
(4) for each test constraint estimation formula in the storage unit, calculating a test constraint value based on the test constraint estimation formula, by using at least one information in the test difficulty calculation elements database in the storage unit among the relationship between netlist, the number of package pins, the number of test pins, an expected operational clock frequency, process technology information, a power consumption during test, and a tester storage space and by the design-for-testability scheme stored in storage unit as a test flow, and thereafter setting at least one information in the test difficulty calculation elements database in the storage unit among the relationship between netlist, the number of package pins, the number of test pins, an expected operational clock frequency, process technology information, a power consumption during test, and a tester storage space, as a test constraint criterion;
(5) if all of the test constraint values for every test constraint estimation formula satisfy the test constraint criterion, then, for the relationship of the design-for-testability scheme and the priority stored in the test flow database in the storage unit, sorting the design-for-testability scheme in an order of the related priority, and then storing the sorted design-for-testability scheme into the storage unit as a test flow as well as using the output unit to show the test flow; and
(6) if any of the test constraint value for every test constraint estimation formula does not satisfy the test constraint criterion, then, using the output unit to show the unsatisfying test constraint value.

6. The computer program according to claim 1, wherein, the storage unit further stores:
at least one test constraint estimation formula in order to calculate a test constraint value based on at least one design-for-testability scheme and the value in the test difficulty calculation elements database; and at least one test constraint criterion correction formula, and wherein
the computer program causes the processing unit to execute steps of:
(4) for each test constraint estimation formula in the storage unit, calculating a test constraint value based on the test constraint estimation formula, by using at least one information in the test difficulty calculation elements database in the storage unit among the relationship between netlist, the number of package pins, the number of test pins, an expected operational clock frequency, process technology information, a power consumption during test, and a tester storage space and by the design-for-testability scheme stored in the storage unit as a test flow, and then setting at least one relationship in the test difficulty calculation elements database in the storage unit among the relationship between netlist, the number of package pins, the number of test pins, an expected operational clock frequency, process technology information, a power consumption during test, and a tester storage space, as a test constraint criterion;

(5) if all of the test constraint values for every test constraint estimation formula satisfy the test constraint criterion, then, for the relationship of the design-for-testability scheme and the priority stored in the test flow database in the storage unit, sorting the design-for-testability scheme in an order of the related priority, and then storing the sorted design-for-testability scheme into the storage unit as a test flow as well as using the output unit to show the test flow; and (6) if any of the test constraint value for every test constraint estimation formula does not satisfy the test constraint criterion, then, for each unsatisfying test constraint criterion value among the test constraint criterion value, updating the corresponding value in the test difficulty calculation elements database based on the test constraint criterion correction formula in the storage unit, and re-processing the steps (1) to (5).

7. The computer program according to claim 1, wherein; the storage unit further stores:
   a computer-aided design tool specifying database comprising the relationship between the design-for-testability scheme and a computer-aided design tool;
   a computer-aided design tool environmental constraint database which stores at least one computer-aided design tool; and
   at least one test constraint criterion correction formula, and wherein
   the computer program causes the processing unit to execute steps of:
   (4) among the design-for-testability scheme included in the computer-aided design tool specifying database, adopting only the design-for-testability scheme which is related to the computer-aided design tool included in the computer-aided design tool environmental constraint database in the storage unit as the design-for-testability scheme included in the test flow stored in the storage unit;
   (5) for the design-for-testability scheme which is not adopted as the one in the test flow, based on the test constraint criterion correction formula, updating information of the test difficulty calculation elements database of the storage unit, and re-process the steps (1) to (4).

8. A computer program stored on a memory of a computer system and being executed on the computer system,
   the computer program providing a test flow for assisting production of a large-scale integrated (LSI) circuit test flow,
   the computer system including
      a storage unit configured to store information,
      a processing unit configured to process information,
      an output unit configured to output the information for a user, and
      an input unit configured to be inputted with a command from the user, wherein the storage unit stores:

a test difficulty calculation elements database including the information indicative of relationship among netlist which denotes a logically synthesized LSI circuit description,
a number of package pins which denote a number of pins supplied by a package,
a number of test pins which denote a number of pins for an LSI circuit test,
an expected operational clock frequency which denotes a clock frequency of the LSI circuit test, process technology information which denotes information about ability of an LSI circuit manufacturing facility and characteristic of manufactured LSI circuits,
a power consumption during test which denotes a power consumed during the LSI circuit test, and
a tester storage space which denotes a size of memory of a tester for the LSI circuit test;
a test menu database including at least two test menu records each indicative of relationship among a test difficulty calculation formula to calculate a test difficulty based on a value in the test difficulty calculation elements database, a test difficulty criterion formula, a design-for-testability scheme, and a priority;
a second test menu database including information indicative of relationship among a second test difficulty calculation formula to calculate a test difficulty based on a value in the test difficulty calculation elements database and the design-for-testability scheme, a second test difficulty criterion formula, a design-for-testability scheme, and a priority; and
a test flow database including at least one piece of information indicative of relationship between the design-for-testability scheme and the priority, wherein
for each test menu record included in the test menu database stored in the storage unit, the computer program causes the processing unit to execute steps of:
(1) calculating a first test difficulty for each test menu record included in the test menu database, based on the test difficulty calculation formula, by using at least one piece of information among pieces of information indicative of relationship among the netlist, the number of package pins, the number of test pins, the expected operational clock frequency, the process technology information, the power consumption during test, and the tester storage space, which are related to one another, in the test difficulty calculation elements database in the storage unit;
(2) identifying all relationships between the design-for-testability scheme and the priority, which are related to the test difficulty criterion formula met by the calculated first test difficulty, from the test menu record in the test menu database, and causing the storage unit to store information indicative of the identified relationship between the design-for-testability scheme and the priority into the test flow database;
(3) calculating a second test difficulty, based on the second test difficulty calculation formula in the second test menu database in the storage unit, by using information indicative of the design-for-testability scheme in the test flow database in the storage unit as well as by using at least one piece of information among pieces of information indicative of the netlist, the number of package pins, the number of test pins, the expected operational clock frequency, the process technology information, the power consumption during test, and the tester storage space, in the test difficulty calculation elements database in the storage unit;

(4) identifying all relationships between the design-for-testability scheme and the priority, which are related to the second test difficulty criterion formula met by the calculated second test difficulty, from the second test menu database in the storage unit, and causing the storage unit to store information indicative of the identified relationship between the design-for-testability scheme and the priority into the test flow database; and (5) sorting the design-for-testability scheme in an order of the related priority based on the relationship between the design-for-testability scheme and the priority in the test flow database in the storage unit, causing the storage unit to store the sorted design-for-testability scheme as a test flow, and causing the output unit to output the test flow to be provided.

9. The computer program according to claim 8, wherein, the storage unit further stores:

a computer-aided design tool specifying database including information indicative of relationship between the design-for-testability scheme and a computer-aided design tool; and a computer-aided design tool environmental constraint database including at least one piece of information indicative of the computer-aided design tool, and wherein the computer program causes the processing unit to further execute a step of:

(4) adopting only a design-for-testability scheme as the test flow, which is related to the computer-aided design tool in the computer-aided design tool environmental constraint database, among the design-for-testability schemes in the computer-aided design tool specifying database stored in the storage unit.

10. The computer program according to claim 8, wherein the storage unit further stores:

a computer-aided design tool specifying database including information indicative of relationship among the design-for-testability scheme, a computer-aided design tool, an usage priority, and a script generation information; and a computer-aided design tool environmental constraint database including at least one computer-aided design tool, and wherein for each design-for-testability scheme as the test flow in the storage unit, the computer program causes the processing unit to further execute a step of:

(4) specifying a computer-aided design tool, which is related to the design-for-testability scheme in the computer-aided design tool specifying database and which has the highest value of the related usage priority, among the computer-aided design tools in the computer-aided design tool environmental constraint database in the storage unit, specifying a script generation information related to the specified computer-aided design tool, and causing the storage unit to store the specified computer-aided design tool and script generation information related to the design-for-testability scheme as a computer-aided design plan, in order to produce the computer-aided design plan in an order of the design-for-testability scheme stored in the storage unit as the test flow.

11. The computer program according to claim 8, wherein the storage unit further stores:

a computer-aided design tool specifying database including information indicative of relationship among the design-for-testability scheme, a computer-aided design tool, an usage priority, and a script generation information;

a convert database including information indicative of relationship between a convert scheme information and a computer-aided design tool flow obtained by relating two or more computer-aided design tools to one another; and a computer-aided design tool environmental constraint database including at least one computer-aided design tool, and wherein the computer program causes the processing unit to execute steps of:

(4) for each design-for-testability scheme as the test flow in the storage unit, specifying a computer-aided design tool, which is related to the design-for-testability scheme in the computer-aided design tool specifying database and which has the highest value of the related usage priority, among the computer-aided design tools in the computer-aided design tool environmental constraint database in the storage unit, specifying a script generation information related to the specified computer-aided design tool, causing the storage unit to store the specified computer-aided design tool and script generation information related to the design-for-testability scheme as a computer-aided design plan, and producing the computer-aided design plan in an order of the design-for-testability scheme stored in the storage unit as the test flow;

(5) based on the order of the computer-aided design tool stored in the storage unit as the computer-aided design plan, specifying the computer-aided design tool flow corresponding to the order of the computer-aided design tool among the convert database in the storage unit, and based on a convert scheme information related to the specified computer-aided design tool flow, relating and inserting the convert script along with the order of the computer-aided design tool, and thereafter causing the storage unit to store a result into the computer-aided design plan.

12. The computer program according to claim 8, wherein the storage unit further stores:

at least one test constraint estimation formula in order to calculate a test constraint value based on at least one design-for-testability scheme and the value in the test difficulty calculation elements database, and wherein the computer program causes the processing unit to further execute steps of:

(4) for each test constraint estimation formula in the storage unit, calculating a test constraint value based on the test constraint estimation formula, by using at least one information in the test difficulty calculation elements database in the storage unit among the relationship between netlist, the number of package pins, the number of test pins, an expected operational clock frequency, process technology information, a power consumption during test, and a tester storage space and by the design-for-testability scheme stored in storage unit as a test flow, and thereafter setting at least one information in the test difficulty calculation elements database in the storage unit among the relationship between netlist, the number of package pins, the number of test pins, an expected operational clock frequency, process technology information, a power consumption during test, and a tester storage space, as a test constraint criterion;

(5) if all of the test constraint values for every test constraint estimation formula satisfy the test constraint criterion, then, for the relationship of the design-for-testability scheme and the priority stored in the test flow database in the storage unit, sorting the design-for-testability scheme in an order of the related priority, and then storing the sorted design-for-testability scheme into the storage unit as a test flow as well as using the output unit to show the test flow; and (6) if any of the test constraint value for every test constraint estimation formula does not satisfy the test constraint criterion, then, using the output unit to show the unsatisfying test constraint value.

13. The computer program according to claim 8, wherein, the storage unit further stores:

at least one test constraint estimation formula in order to calculate a test constraint value based on at least one design-for-testability scheme and the value in the test difficulty calculation elements database; and at least one test constraint criterion correction formula, and wherein the computer program causes the processing unit to execute steps of:

(4) for each test constraint estimation formula in the storage unit, calculating a test constraint value based on the test constraint estimation formula, by using at least one information in the test difficulty calculation elements database in the storage unit among the relationship between netlist, the number of package pins, the number of test pins, an expected operational clock frequency, process technology information, a power consumption during test, and a tester storage space and by the design-for-testability scheme stored in the storage unit as a test flow, and then setting at least one relationship in the test difficulty calculation elements database in the storage unit among the relationship between netlist, the number of package pins, the number of test pins, an expected operational clock frequency, process technology information, a power consumption during test, and a tester storage space, as a test constraint criterion;

(5) if all of the test constraint values for every test constraint estimation formula satisfy the test constraint criterion, then, for the relationship of the design-for-testability scheme and the priority stored in the test flow database in the storage unit, sorting the design-for-testability scheme in an order of the related priority, and then storing the sorted design-for-testability scheme into the storage unit as a test flow as well as using the output unit to show the test flow; and (6) if any of the test constraint value for every test constraint estimation formula does not satisfy the test constraint criterion, then, for each unsatisfying test constraint criterion value among the test constraint criterion value, updating the corresponding value in the test difficulty calculation elements database based on the test constraint criterion correction formula in the storage unit, and re-processing the steps (1) to (5).

14. The computer program according to claim 8, wherein; the storage unit further stores:

a computer-aided design tool specifying database comprising the relationship between the design-for-testability scheme and a computer-aided design tool;

a computer-aided design tool environmental constraint database which stores at least one computer-aided design tool; and at least one test constraint criterion correction formula, and wherein the computer program causes the processing unit to execute steps of:

(4) among the design-for-testability scheme included in the computer-aided design tool specifying database, adopting only the design-for-testability scheme which is related to the computer-aided design tool included in the computer-aided design tool environmental constraint database in the storage unit as the design-for-testability scheme included in the test flow stored in the storage unit;

(5) for the design-for-testability scheme which is not adopted as the one in the test flow, based on the test constraint criterion correction formula, updating information of the test difficulty calculation elements database of the storage unit, and re-process the steps (1) to (4).

15. A computer program stored on a memory of a computer system and being executed on the computer system, the computer program providing a test flow for assisting production of a large-scale integrated (LSI) circuit test flow, the computer system including a storage unit configured to store information, a processing unit configured to process information, an output unit configured to output the information for a user, and an input unit configured to be inputted with a command from the user, wherein the storage unit stores:

a test difficulty calculation elements database including the information indicative of relationship among netlist which denotes a logically synthesized LSI circuit description, a number of package pins which denote a number of pins supplied by a package, a number of test pins which denotes a number of pins for an LSI circuit test an expected operational clock frequency which denotes a clock frequency of the LSI circuit test, process technology information which denotes information about ability of an LSI circuit manufacturing facility and characteristic of manufactured LSI circuits, a power consumption during test which denotes a power consumed during the LSI circuit test, and a tester storage space which denotes a size of memory of a tester for the LSI circuit test;

a test menu database including at least two test menu records each indicative of relationship among a test difficulty calculation formula to calculate a test difficulty based on a value in the test difficulty calculation elements database, a test difficulty criterion formula, a design-for-testability scheme, and a priority;

a second test menu database including at least two second test menu records each indicative of relationship among a second test difficulty calculation formula to calculate a test difficulty based on a value in the test difficulty calculation elements database and the design-for-testability scheme, a second test difficulty criterion formula, a design-for-testability scheme, and a priority; and a test flow database including at least one piece of information indicative of relationship between the design-for-testability scheme and the priority, wherein for each test menu record included in the test menu database stored in the storage unit, the computer program causes the processing unit to execute steps of:

(1) calculating a first test difficulty for each test menu record included in the test menu database, based on the test difficulty calculation formula, by using at least one piece of information among pieces of information indicative of relationship among the netlist, the number of package pins, the number of test pins, the expected operational clock frequency, the process technology information, the power consumption during test, and the tester storage space, which are related to one another, in the test difficulty calculation elements database in the storage unit; and (2) identifying all relationships between the design-for-testability scheme and the priority, which are related to the test difficulty criterion formula met by the calculated first test difficulty, from the test menu record in the test menu database, and causing the storage unit to store information indicative of the identified relationship between the design-for-testability scheme and the priority into the test flow database, and wherein for each second test menu record included in the second test menu database stored in the storage unit, the computer program causes the processing unit to execute steps of:

(3) calculating a second test difficulty, for each second test menu record in the second test menu database, based on the second test difficulty calculation formula in the second test menu database in the storage unit, by using information indicative of the design-for-testability scheme in the test flow database in the storage unit as well as by using at least one piece of information among pieces of information indicative of the netlist, the number of package pins, the number of test pins, the expected operational clock frequency, the process technology information, the power consumption during test, and the tester storage space, in the test difficulty calculation elements database in the storage unit;

(4) identifying all relationships between the design-for-testability scheme and the priority, which are related to the second test difficulty criterion formula met by the calculated second test difficulty, from the second test menu record in the second test menu database in the storage unit, and causing the storage unit to store information indicative of the identified relationship between the design-for-testability scheme and the priority into the test flow database; and (5) sorting the design-for-testability scheme in an order of the related priority based on the relationship between the design-for-testability scheme and the priority in the test flow database in the storage unit, causing the storage unit to store the sorted design-for-testability scheme as a test flow, and causing the output unit to output the test flow to be provided.

16. The computer program according to claim 15, wherein, the storage unit further stores:

a computer-aided design tool specifying database including information indicative of relationship between the design-for-testability scheme and a computer-aided design tool; and a computer-aided design tool environmental constraint database including at least one piece of information indicative of the computer-aided design tool, and wherein the computer program causes the processing unit to further execute a step of:

(4) adopting only a design-for-testability scheme as the test flow, which is related to the computer-aided design tool in the computer-aided design tool environmental constraint database, among the design-for-testability schemes in the computer-aided design tool specifying database stored in the storage unit.

17. The computer program according to claim 15, wherein the storage unit further stores:

a computer-aided design tool specifying database including information indicative of relationship among the design-for-testability scheme, a computer-aided design tool, an usage priority, and a script generation information; and a computer-aided design tool environmental constraint database including at least one computer-aided design tool, and wherein for each design-for-testability scheme as the test flow in the storage unit, the computer program causes the processing unit to further execute a step of:

(4) specifying a computer-aided design tool, which is related to the design-for-testability scheme in the computer-aided design tool specifying database and which has the highest value of the related usage priority, among the computer-aided design tools in the computer-aided design tool environmental constraint database in the storage unit, specifying a script generation information related to the specified computer-aided design tool, and causing the storage unit to store the specified computer-aided design tool and script generation information related to the design-for-testability scheme as a computer-aided design plan, in order to produce the computer-aided design plan in an order of the design-for-testability scheme stored in the storage unit as the test flow.

18. The computer program according to claim 15, wherein the storage unit further stores:

a computer-aided design tool specifying database including information indicative of relationship among the design-for-testability scheme, a computer-aided design tool, an usage priority, and a script generation information;

a convert database including information indicative of relationship between a convert scheme information and a computer-aided design tool flow obtained by relating two or more computer-aided design tools to one another; and a computer-aided design tool environmental constraint database including at least one computer-aided design tool, and wherein the computer program causes the processing unit to execute steps of:

(4) for each design-for-testability scheme as the test flow in the storage unit, specifying a computer-aided design tool, which is related to the design-for-testability scheme in the computer-aided design tool specifying database and which has the highest value of the related usage priority, among the computer-aided design tools in the computer-aided design tool environmental constraint database in the storage unit, specifying a script generation information related to the specified computer-aided design tool, causing the storage unit to store the specified computer-aided design tool and script generation information related to the design-for-testability scheme as a computer-aided design plan, and producing the computer-aided design plan in an order of the design-for-testability scheme stored in the storage unit as the test flow;

(5) based on the order of the computer-aided design tool stored in the storage unit as the computer-aided design plan, specifying the computer-aided design tool flow corresponding to the order of the computer-aided design tool among the convert database in the storage unit, and based on a convert scheme information related to the specified computer-aided design tool flow, relating and inserting the convert script along with the order of the computer-aided design tool, and thereafter causing the storage unit to store a result into the computer-aided design plan.

19. The computer program according to claim 15, wherein the storage unit further stores:
at least one test constraint estimation formula in order to calculate a test constraint value based on at least one design-for-testability scheme and the value in the test difficulty calculation elements database, and wherein
the computer program causes the processing unit to further execute steps of:
(4) for each test constraint estimation formula in the storage unit, calculating a test constraint value based on the test constraint estimation formula, by using at least one information in the test difficulty calculation elements database in the storage unit among the relationship between netlist, the number of package pins, the number of test pins, an expected operational clock frequency, process technology information, a power consumption during test, and a tester storage space and by the design-for-testability scheme stored in storage unit as a test flow, and thereafter setting at least one information in the test difficulty calculation elements database in the storage unit among the relationship between netlist, the number of package pins, the number of test pins, an expected operational clock frequency, process technology information, a power consumption during test, and a tester storage space, as a test constraint criterion;
(5) if all of the test constraint values for every test constraint estimation formula satisfy the test constraint criterion, then, for the relationship of the design-for-testability scheme and the priority stored in the test flow database in the storage unit, sorting the design-for-testability scheme in an order of the related priority, and then storing the sorted design-for-testability scheme into the storage unit as a test flow as well as using the output unit to show the test flow; and
(6) if any of the test constraint value for every test constraint estimation formula does not satisfy the test constraint criterion, then, using the output unit to show the unsatisfying test constraint value.

20. The computer program according to claim 15, wherein, the storage unit further stores:
at least one test constraint estimation formula in order to calculate a test constraint value based on at least one design-for-testability scheme and the value in the test difficulty calculation elements database; and at least one test constraint criterion correction formula, and wherein
the computer program causes the processing unit to execute steps of:
(4) for each test constraint estimation formula in the storage unit, calculating a test constraint value based on the test constraint estimation formula, by using at least one information in the test difficulty calculation elements database in the storage unit among the relationship between netlist, the number of package pins, the number of test pins, an expected operational clock frequency, process technology information, a power consumption during test, and a tester storage space and by the design-for-testability scheme stored in the storage unit as a test flow, and then setting at least one relationship in the test difficulty calculation elements database in the storage unit among the relationship between netlist, the number of package pins, the number of test pins, an expected operational clock frequency, process technology information, a power consumption during test, and a tester storage space, as a test constraint criterion;
(5) if all of the test constraint values for every test constraint estimation formula satisfy the test constraint criterion, then, for the relationship of the design-for-testability scheme and the priority stored in the test flow database in the storage unit, sorting the design-for-testability scheme in an order of the related priority, and then storing the sorted design-for-testability scheme into the storage unit as a test flow as well as using the output unit to show the test flow; and
(6) if any of the test constraint value for every test constraint estimation formula does not satisfy the test constraint criterion, then, for each unsatisfying test constraint criterion value among the test constraint criterion value, updating the corresponding value in the test difficulty calculation elements database based on the test constraint criterion correction formula in the storage unit, and re-processing the steps (1) to (5).

21. The computer program according to claim 15, wherein; the storage unit further stores:
a computer-aided design tool specifying database comprising the relationship between the design-for-testability scheme and a computer-aided design tool;
a computer-aided design tool environmental constraint database which stores at least one computer-aided design tool; and
at least one test constraint criterion correction formula, and wherein
the computer program causes the processing unit to execute steps of:
(4) among the design-for-testability scheme included in the computer-aided design tool specifying database, adopting only the design-for-testability scheme which is related to the computer-aided design tool included in the computer-aided design tool environmental constraint database in the storage unit as the design-for-testability scheme included in the test flow stored in the storage unit;
(5) for the design-for-testability scheme which is not adopted as the one in the test flow, based on the test constraint criterion correction formula, updating information of the test difficulty calculation elements database of the storage unit, and re-process the steps (1) to (4).

22. A computer program stored on a memory of a computer system and being executed on the computer system,
the computer program providing a test flow for assisting production of a large-scale integrated (LSI) circuit test flow,
the computer system including
a storage unit configured to store information,
a processing unit configured to process information,
an output unit configured to output the information for a user, and
an input unit configured to be inputted with a command from the user, wherein the storage unit stores:
a test difficulty calculation elements database including the information indicative of relationship among netlist which denotes a logically synthesized LSI circuit description,
a number of package pins which denote a number of pins supplied by a package,
a number of test pins which denotes a number of pins for a LSI circuit test, an expected operational clock frequency which denotes a clock frequency of the LSI circuit test, process technology information which denotes information about ability of an LSI circuit manufacturing facility and characteristic of manufactured LSI circuits, a power consumption during test which denotes a power consumed during the LSI circuit test, and a tester storage space which denotes a size of memory of a tester for the LSI circuit test;

a test menu database including at least two test menu records each indicative of relationship among a test difficulty calculation formula to calculate a test difficulty based on a value in the test difficulty calculation elements database or based on a value in the test difficulty calculation elements database and a design-for-testability scheme, a test difficulty criterion formula, the design-for-testability scheme, and a priority; and a test flow database including at least one piece of information indicative of relationship between the design-for-testability scheme and the priority, wherein for each test menu record included in the test menu database stored in the storage unit, the computer program causes the processing unit to execute steps of:

(1) calculating a first test difficulty, based on the test difficulty calculation formula, by using at least one piece of information among pieces of information indicative of relationship among the netlist, the number of package pins, the number of test pins, the expected operational clock frequency, the process technology information, the power consumption during test, and the tester storage space, in the test difficulty calculation elements database in the storage unit;

(2) identifying all relationships between the design-for-testability scheme and the priority, which are related to the test difficulty criterion formula met by the calculated first test difficulty, from the test menu database, and causing the storage unit to store information indicative of the identified relationship between the design-for-testability scheme and the priority into the test flow database;

(3) calculating a second test difficulty, based on the test difficulty calculation formula, by using information indicative of the design-for-testability scheme in the test flow database in the storage unit as well as by using at least one piece of information among pieces of information indicative of the netlist, the number of package pins, the number of test pins, the expected operational clock frequency, the process technology information, the power consumption during test, and the tester storage space, in the test difficulty calculation elements database in the storage unit;

(4) identifying all relationships between the design-for-testability scheme and the priority, which are related to the test difficulty criterion formula met by the calculated second test difficulty, from the test menu database in the storage unit, and causing the storage unit to store information indicative of the identified relationship between the design-for-testability scheme and the priority into the test flow database; and (5) sorting the design-for-testability scheme in an order of the related priority based on the relationship between the design-for-testability scheme and the priority included in the test flow database stored in the storage unit, causing the storage unit to store the sorted design-for-testability scheme as a test flow, and causing the output unit to output the test flow to be provided.

23. The computer program according to claim 22, wherein, the storage unit further stores:

a computer-aided design tool specifying database including information indicative of relationship between the design-for-testability scheme and a computer-aided design tool; and a computer-aided design tool environmental constraint database including at least one piece of information indicative of the computer-aided design tool, and wherein the computer program causes the processing unit to further execute a step of:

(4) adopting only a design-for-testability scheme as the test flow, which is related to the computer-aided design tool in the computer-aided design tool environmental constraint database, among the design-for-testability schemes in the computer-aided design tool specifying database stored in the storage unit.

24. The computer program according to claim 22, wherein the storage unit further stores:

a computer-aided design tool specifying database including information indicative of relationship among the design-for-testability scheme, a computer-aided design tool, an usage priority, and a script generation information; and a computer-aided design tool environmental constraint database including at least one computer-aided design tool, and wherein for each design-for-testability scheme as the test flow in the storage unit, the computer program causes the processing unit to further execute a step of:

(4) specifying a computer-aided design tool, which is related to the design-for-testability scheme in the computer-aided design tool specifying database and which has the highest value of the related usage priority, among the computer-aided design tools in the computer-aided design tool environmental constraint database in the storage unit, specifying a script generation information related to the specified computer-aided design tool, and causing the storage unit to store the specified computer-aided design tool and script generation information related to the design-for-testability scheme as a computer-aided design plan, in order to produce the computer-aided design plan in an order of the design-for-testability scheme stored in the storage unit as the test flow.

25. The computer program according to claim 22, wherein the storage unit further stores:

a computer-aided design tool specifying database including information indicative of relationship among the design-for-testability scheme, a computer-aided design tool, an usage priority, and a script generation information;

a convert database including information indicative of relationship between a convert scheme information and a computer-aided design tool flow obtained by relating two or more computer-aided design tools to one another; and a computer-aided design tool environmental constraint database including at least one computer-aided design tool, and wherein the computer program causes the processing unit to execute steps of:

(4) for each design-for-testability scheme as the test flow in the storage unit, specifying a computer-aided design tool, which is related to the design-for-testability scheme in the computer-aided design tool specifying database and which has the highest value of the related usage priority, among the computer-aided design tools in the computer-aided design tool environmental constraint database in the storage unit, specifying a script generation information related to the specified computer-aided design tool, causing the storage unit to store the specified computer-aided design tool and script generation information related to the design-for-testability scheme as a computer-aided design plan, and producing the computer-aided design plan in an order of the design-for-testability scheme stored in the storage unit as the test flow;

(5) based on the order of the computer-aided design tool stored in the storage unit as the computer-aided design plan, specifying the computer-aided design tool flow corresponding to the order of the computer-aided design tool among the convert database in the storage unit, and based on a convert scheme information related to the specified computer-aided design tool flow, relating and inserting the convert script along with the order of the computer-aided design tool, and thereafter causing the storage unit to store a result into the computer-aided design plan.

26. The computer program according to claim 22, wherein the storage unit further stores:

at least one test constraint estimation formula in order to calculate a test constraint value based on at least one design-for-testability scheme and the value in the test difficulty calculation elements database, and wherein the computer program causes the processing unit to further execute steps of:

(4) for each test constraint estimation formula in the storage unit, calculating a test constraint value based on the test constraint estimation formula, by using at least one information in the test difficulty calculation elements database in the storage unit among the relationship between netlist, the number of package pins, the number of test pins, an expected operational clock frequency, process technology information, a power consumption during test, and a tester storage space and by the design-for-testability scheme stored in storage unit as a test flow, and thereafter setting at least one information in the test difficulty calculation elements database in the storage unit among the relationship between netlist, the number of package pins, the number of test pins, an expected operational clock frequency, process technology information, a power consumption during test, and a tester storage space, as a test constraint criterion;

(5) if all of the test constraint values for every test constraint estimation formula satisfy the test constraint criterion, then, for the relationship of the design-for-testability scheme and the priority stored in the test flow database in the storage unit, sorting the design-for-testability scheme in an order of the related priority, and then storing the sorted design-for-testability scheme into the storage unit as a test flow as well as using the output unit to show the test flow; and (6) if any of the test constraint value for every test constraint estimation formula does not satisfy the test constraint criterion, then, using the output unit to show the unsatisfying test constraint value.

27. The computer program according to claim 22, wherein, the storage unit further stores:

at least one test constraint estimation formula in order to calculate a test constraint value based on at least one design-for-testability scheme and the value in the test difficulty calculation elements database; and at least one test constraint criterion correction formula, and wherein the computer program causes the processing unit to execute steps of:

(4) for each test constraint estimation formula in the storage unit, calculating a test constraint value based on the test constraint estimation formula, by using at least one information in the test difficulty calculation elements database in the storage unit among the relationship between netlist, the number of package pins, the number of test pins, an expected operational clock frequency, process technology information, a power consumption during test, and a tester storage space and by the design-for-testability scheme stored in the storage unit as a test flow, and then setting at least one relationship in the test difficulty calculation elements database in the storage unit among the relationship between netlist, the number of package pins, the number of test pins, an expected operational clock frequency, process technology information, a power consumption during test, and a tester storage space, as a test constraint criterion;

(5) if all of the test constraint values for every test constraint estimation formula satisfy the test constraint criterion, then, for the relationship of the design-for-testability scheme and the priority stored in the test flow database in the storage unit, sorting the design-for-testability scheme in an order of the related priority, and then storing the sorted design-for-testability scheme into the storage unit as a test flow as well as using the output unit to show the test flow; and (6) if any of the test constraint value for every test constraint estimation formula does not satisfy the test constraint criterion, then, for each unsatisfying test constraint criterion value among the test constraint criterion value, updating the corresponding value in the test difficulty calculation elements database based on the test constraint criterion correction formula in the storage unit, and re-processing the steps (1) to (5).

28. The computer program according to claim 22, wherein; the storage unit further stores:

a computer-aided design tool specifying database comprising the relationship between the design-for-testability scheme and a computer-aided design tool;

a computer-aided design tool environmental constraint database which stores at least one computer-aided design tool; and at least one test constraint criterion correction formula, and wherein the computer program causes the processing unit to execute steps of:

(4) among the design-for-testability scheme included in the computer-aided design tool specifying database, adopting only the design-for-testability scheme which is related to the computer-aided design tool included in the computer-aided design tool environmental constraint database in the storage unit as the design-for-testability scheme included in the test flow stored in the storage unit;

(5) for the design-for-testability scheme which is not adopted as the one in the test flow, based on the test constraint criterion correction formula, updating information of the test difficulty calculation elements database of the storage unit, and re-process the steps (1) to (4).

* * * * *